(12) United States Patent
Sawada

(10) Patent No.: US 8,786,061 B2
(45) Date of Patent: Jul. 22, 2014

(54) SEMICONDUCTOR DEVICE

(75) Inventor: Ken Sawada, Kanagawa (JP)

(73) Assignee: Sony Corporation (JP)

( * ) Notice: Subject to any disclaimer, the term of this patent is extended or adjusted under 35 U.S.C. 154(b) by 135 days.

(21) Appl. No.: 13/439,025

(22) Filed: Apr. 4, 2012

(65) Prior Publication Data
US 2012/0256318 A1    Oct. 11, 2012

(30) Foreign Application Priority Data

Apr. 11, 2011 (JP) ................................. 2011-087048

(51) Int. Cl.
| | | |
|---|---|---|
| H01L 23/58 | (2006.01) | |
| H01L 23/552 | (2006.01) | |
| H01L 23/48 | (2006.01) | |
| H01L 23/52 | (2006.01) | |
| H01L 29/40 | (2006.01) | |

(52) U.S. Cl.
USPC ........... 257/664; 257/659; 257/728; 257/773; 257/777

(58) Field of Classification Search
CPC ... H01L 24/34; H01L 23/5286; H01L 23/552; H01L 23/5225; H01L 2225/06537
USPC ............ 257/664, 659, 728, 773, 777
See application file for complete search history.

(56) References Cited

U.S. PATENT DOCUMENTS

| | | | | |
|---|---|---|---|---|
| 6,307,252 | B1 * | 10/2001 | Knoedl, Jr. .................. | 257/659 |
| 6,774,484 | B2 * | 8/2004 | Mimino et al. ............. | 257/728 |
| 7,605,450 | B2 * | 10/2009 | Bromberger ................ | 257/664 |
| 8,487,430 | B1 * | 7/2013 | Walworth .................... | 257/728 |
| 8,558,355 | B2 * | 10/2013 | Chen et al. .................. | 257/659 |
| 2002/0140089 | A1 * | 10/2002 | Mimino et al. ............. | 257/728 |
| 2006/0255434 | A1 * | 11/2006 | Degani et al. .............. | 257/659 |
| 2013/0234305 | A1 * | 9/2013 | Lin et al. .................... | 257/664 |
| 2013/0256849 | A1 * | 10/2013 | Danny et al. ............... | 257/664 |

FOREIGN PATENT DOCUMENTS

| | | |
|---|---|---|
| JP | 2004-363975 | 12/2004 |
| JP | 2010-245506 | 10/2010 |

OTHER PUBLICATIONS

Soon We Ho et al.; High RF Performance TSV Silicon Carrier for High Frequency; 2008 Electronics and Components Technology Conference.

* cited by examiner

Primary Examiner — David Zarneke
(74) Attorney, Agent, or Firm — Sheridan Ross P.C.

(57) ABSTRACT

A semiconductor device includes a first semiconductor substrate and a second semiconductor substrate laminated with an insulating layer, a first transmission line formed on the first semiconductor substrate, the first transmission line including a signal line and a ground, a second transmission line formed on the second semiconductor substrate, the second transmission line including a signal line and a ground, a first via layer for the signal lines, the first via layer for the signal lines being formed of a conductor layer formed within a via hole, a first via layer for the grounds, the first via layer for the grounds being formed of a conductor layer formed within a via hole, and a second via layer for the grounds, the second via layer for the grounds being formed of a conductor layer formed within a via hole.

6 Claims, 15 Drawing Sheets

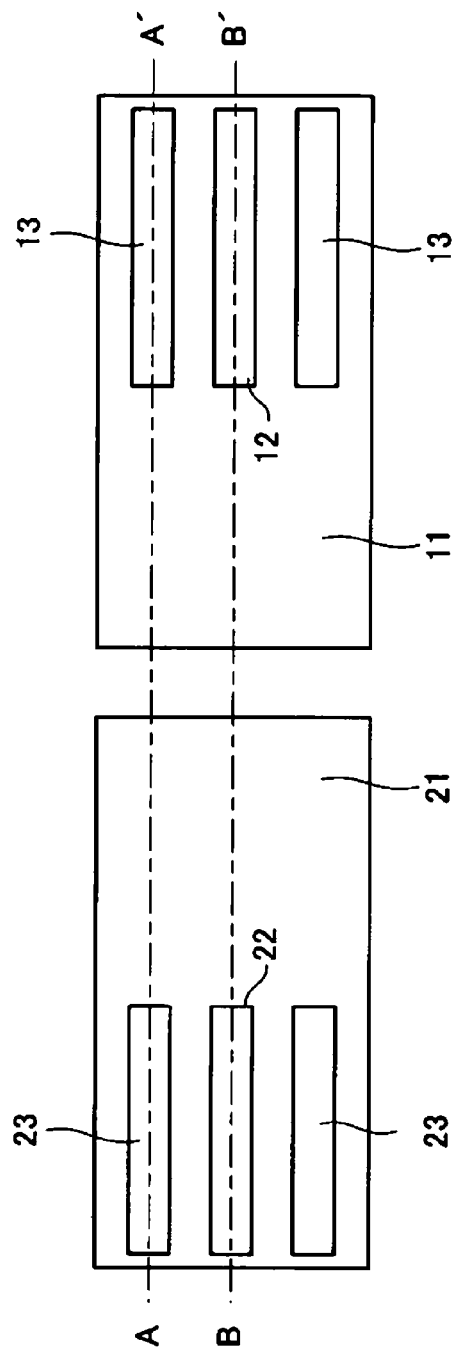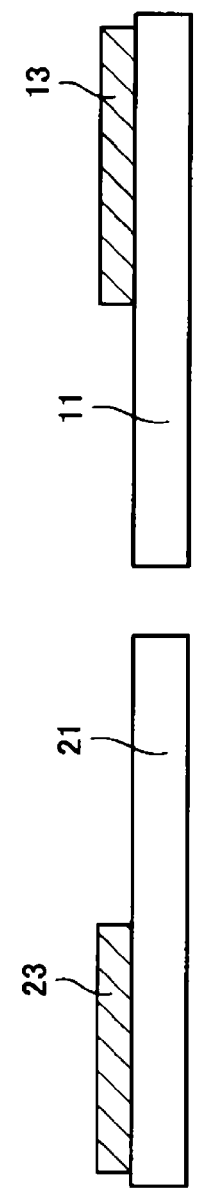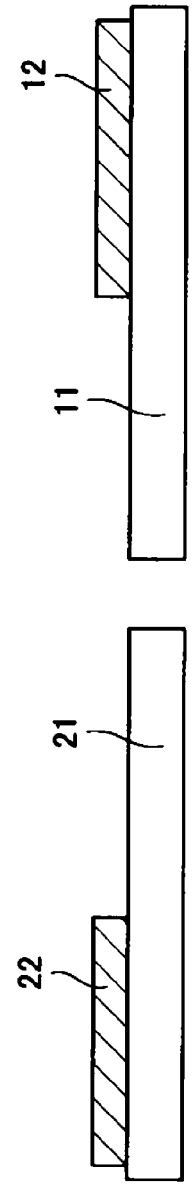
FIG. 2A
FIG. 2B
FIG. 2C

SEMICONDUCTOR DEVICE

BACKGROUND

The present technology relates to a semiconductor device including a plurality of semiconductor substrates on which a high-frequency circuit is formed, the high-frequency circuits of the respective semiconductor substrates being electrically connected to each other.

While the miniaturization of elements in semiconductor devices made progress so far, the miniaturization has recently become difficult due to the diffraction limit of photolithography.

Accordingly, for further integration, an attempt has been made to improve an effective degree of integration by three-dimensionally laminating and integrating a plurality of semiconductor chips.

In addition to a configuration obtained by laminating circuit elements of a same kind as a constitution obtained by laminating a plurality of semiconductor chips, an attempt has been made to compound different functions into one chip by laminating circuit elements of different kinds such for example as an arithmetic circuit chip and a memory circuit chip. Compounding such different functions can not only improve the degree of integration but also improve functionality.

When a high-frequency circuit is used as a circuit element to be laminated, and the high-frequency circuit is laminated to another circuit element or another high-frequency circuit, the chip can be provided with a communicating function, or signals of various frequencies can be handled on one chip.

In addition, because the size of circuit parts of a high-frequency circuit is determined by the operating frequency of the high-frequency circuit, it is difficult to improve the degree of integration of the high-frequency circuit by miniaturization. It is therefore desirable to improve the degree of integration of high-frequency circuit elements by laminating the high-frequency circuit elements three-dimensionally. Improving the degree of integration of high-frequency circuit elements can enhance the performance of the high-frequency circuit elements.

When two semiconductor substrates on which a high-frequency circuit is formed are laminated to each other, a conductor for connection needs to be formed to connect the high-frequency circuits of the respective semiconductor substrates to each other.

Typical transmission lines of high-frequency circuits formed on semiconductor substrates include microstrip lines and coplanar lines. Other transmission lines include coaxial lines and strip lines.

These transmission lines of the high-frequency circuits have a ground for a signal line, and transmit electromagnetic waves by respective conductors of the signal line and the ground.

However, when the transmission lines of the respective high-frequency circuits are simply connected to each other by conductor layers within via holes (which conductor layers will hereinafter be referred to as "via layers), electromagnetic waves are radiated from the via layer connecting the signal lines of the transmission lines to each other, and may affect the operation of a peripheral circuit.

Accordingly, strengthening a ground in a connecting part connecting the transmission lines of the respective high-frequency circuits to each other has been proposed to suppress the radiation of electromagnetic waves to the outside of the transmission lines.

For example, S. W. Ho et al., IEEE ECTC 2008, 27 May to 30 May 2008, p. 1946 referred to as Non-Patent Document 1 hereinafter proposes a constitution in which a coplanar line formed on an upper surface of a semiconductor substrate on a lower side and a coplanar line formed on an upper surface of a semiconductor substrate on an upper side are connected to each other by using via layers of a coaxial structure penetrating the semiconductor substrate on the upper side. In this constitution, a ground is strengthened by arranging the via layers of the coaxial structure such that the via layer connected to ground lines is disposed so as to surround the via layer connected to signal lines.

In addition, for example, Japanese Patent Laid-Open No. 2004-363975 (referred to as Patent Document 1 hereinafter) discloses a constitution in which the signal line of a coplanar line formed on a lower surface of a semiconductor substrate and the signal line of a coplanar line formed on an upper surface of the semiconductor substrate are connected to each other by a via layer penetrating the semiconductor substrate.

The constitution disclosed in Patent Document 1 strengthens a ground by further extending a ground conductor from each of the coplanar lines and also forming a ground conductor on the periphery of a connecting part connecting the via layer to the signal lines and on an opposite side of the semiconductor substrate from each of the coplanar lines.

Without being limited to semiconductor devices including high-frequency circuits, consideration has been given also to three-dimensional lamination of a plurality of semiconductor substrates in ordinary semiconductor devices.

For example, a constitution in which circuits formed on two respective semiconductor substrates are connected to each other by using via layers has been proposed (see Japanese Patent Laid-Open No. 2010-245506 referred to as Patent Document 2 hereinafter, for example).

In the constitution of Patent Document 2, a plurality of kinds of via layers having different depths which via layers penetrate the semiconductor substrates and insulating layers between the two semiconductor substrates are formed, and the circuits formed on the two respective semiconductor substrates are connected to each other by using the plurality of kinds of via layers.

SUMMARY

In the constitution of Non-Patent Document 1, the ground via layer in the coaxial structure surrounds the via layer connecting the signal lines to each other in close vicinity to the via layer connecting the signal lines to each other, and the via layer connecting the signal lines to each other cannot be directly connected to the coplanar line on the lower semiconductor substrate and is thus connected via a bump.

Because the via layer connecting the signal lines to each other is connected via a bump, the constitution and manufacturing processes are complicated, and the reliability of the connection is lower than in the case where the via layer is directly connected to the signal lines.

In the constitution of Patent Document 1, there are ground layers on the periphery of the connecting part connecting the via layer to the signal lines. However, the respective ground layers on the lower surface and the upper surface of the semiconductor substrate are not connected. Therefore, grounded capacitance may fluctuate between the lower surface and the upper surface, and affect signal transmission. In addition, there is no ground layer on the periphery of the via layer. Therefore, a ground on the periphery of the via layer is weakened.

Further, the dimensions of the via layer and the ground layers are substantially determined by the dimensions of the coplanar lines, so that there is a low degree of freedom of dimensions. It is thus difficult to change the characteristic impedance of the via part including the via layer. It is therefore difficult to achieve impedance matching when an upper high-frequency circuit and a lower high-frequency circuit have different characteristic impedances.

In the constitution of Patent Document 2, circuits of an upper semiconductor substrate and a lower semiconductor substrate are merely connected to each other by via layers in an ordinary semiconductor device, and no particular consideration is given to the characteristic impedance of a via part including the via layers.

It is desirable to provide a semiconductor device that can strengthen a ground on the periphery of a via layer connecting transmission lines to each other, and which enables the characteristic impedance of a via part to be adjusted.

A semiconductor device according to an embodiment of the present technology includes: a first semiconductor substrate and a second semiconductor substrate laminated with an insulating layer interposed between the first semiconductor substrate and the second semiconductor substrate; a first transmission line formed on the first semiconductor substrate, the first transmission line including a signal line and a ground; and a second transmission line formed on the second semiconductor substrate, the second transmission line including a signal line and a ground.

The semiconductor device also includes a first via layer for the signal lines, the first via layer for the signal lines being formed of a conductor layer formed within a via hole, and connected to the signal line of the first transmission line and the signal line of the second transmission line.

The semiconductor device also includes a first via layer for the grounds, the first via layer for the grounds being formed of a conductor layer formed within a via hole, and connected to the ground of the first transmission line and the ground of the second transmission line.

The semiconductor device further includes a second via layer for the grounds, the second via layer for the grounds being formed of a conductor layer formed within a via hole, connected to the ground of the first transmission line and/or the ground of the second transmission line, and including a via layer in a shape of a band, the via layer in the shape of the band being formed so as to be opposed to the first via layer for the signal lines.

The constitution of the semiconductor device according to the above-described embodiment of the present technology includes the first via layer for the signal lines, the first via layer for the signal lines being connected to the signal line of the first transmission line and the signal line of the second transmission line, and the first via layer for the grounds, the first via layer for the grounds being connected to the ground of the first transmission line and the ground of the second transmission line. Thereby, the first transmission line and the second transmission line are connected to each other, so that high frequencies and the like can be transmitted between the first transmission line and the second transmission line.

The second via layer for the grounds, the second via layer for the grounds including the via layer in the shape of the band which via layer is formed so as to be opposed to the first via layer for the signal lines, and being connected to the ground, can strengthen a ground for the first via layer for the signal lines. In addition, the characteristic impedance of a via part including these via layers can be adjusted by adjusting the dimensions of the first via layer for the signal line and the second via layer for the grounds.

According to the above-described present technology, it is possible to strengthen the ground for the first via layer for the signal lines, and thus suppress the radiation of electromagnetic waves from the via layer to the outside.

In addition, because the characteristic impedance of the via part including the via layers can be adjusted, impedance matching can be achieved even when the first transmission line and the second transmission line connected to each other by the via layers have different characteristic impedances.

DETAILED DESCRIPTION OF THE PREFERRED EMBODIMENTS

The best mode for carrying out the present technology (which best mode will hereinafter be referred to as embodiments) will hereinafter be described.

Incidentally, description will be made in the following order.

1. Outlines of Present Technology
2. First Embodiment
3. Second Embodiment
4. Third Embodiment
5. Fourth Embodiment 1. Outlines of Present Technology Prior to the description of concrete embodiments of the present technology, outlines of the present technology will first be described.

Figure 9A:
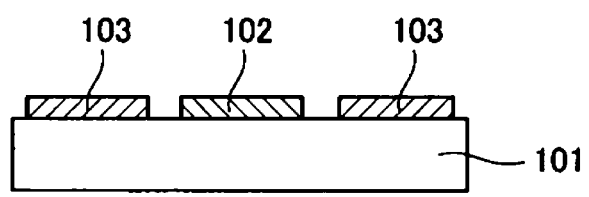
FIG. 9A is a schematic sectional view of a coplanar line.
Figure 9B:
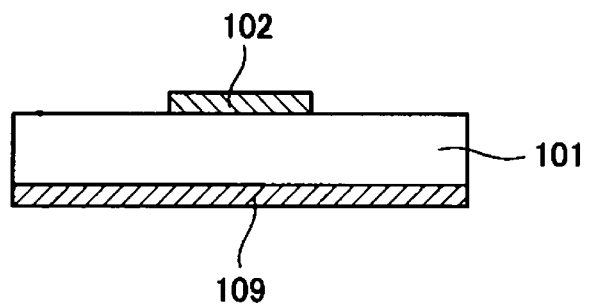
FIG. 9B is a schematic sectional view of a microstrip line.

Of the transmission lines of high-frequency circuits described above, a coplanar line is shown in a schematic sectional view of FIG. 9A, and a microstrip line is shown in a schematic sectional view of FIG. 9B.

As shown in FIG. 9A, the coplanar line has a signal line 102 in a linear shape and ground lines 103 in a linear shape on one principal surface (upper surface in the figure) of a semiconductor substrate 101, the two ground lines 103 being parallel with each other on both sides of the signal line 102 so as to sandwich the signal line 102.

As shown in FIG. 9B, the microstrip line has a signal line 102 formed in a linear shape on one principal surface (upper surface in the figure) of a semiconductor substrate 101, and has a ground layer 109 formed in a planar shape on another principal surface (lower surface in the figure) of the semiconductor substrate 101.

Figure 10:
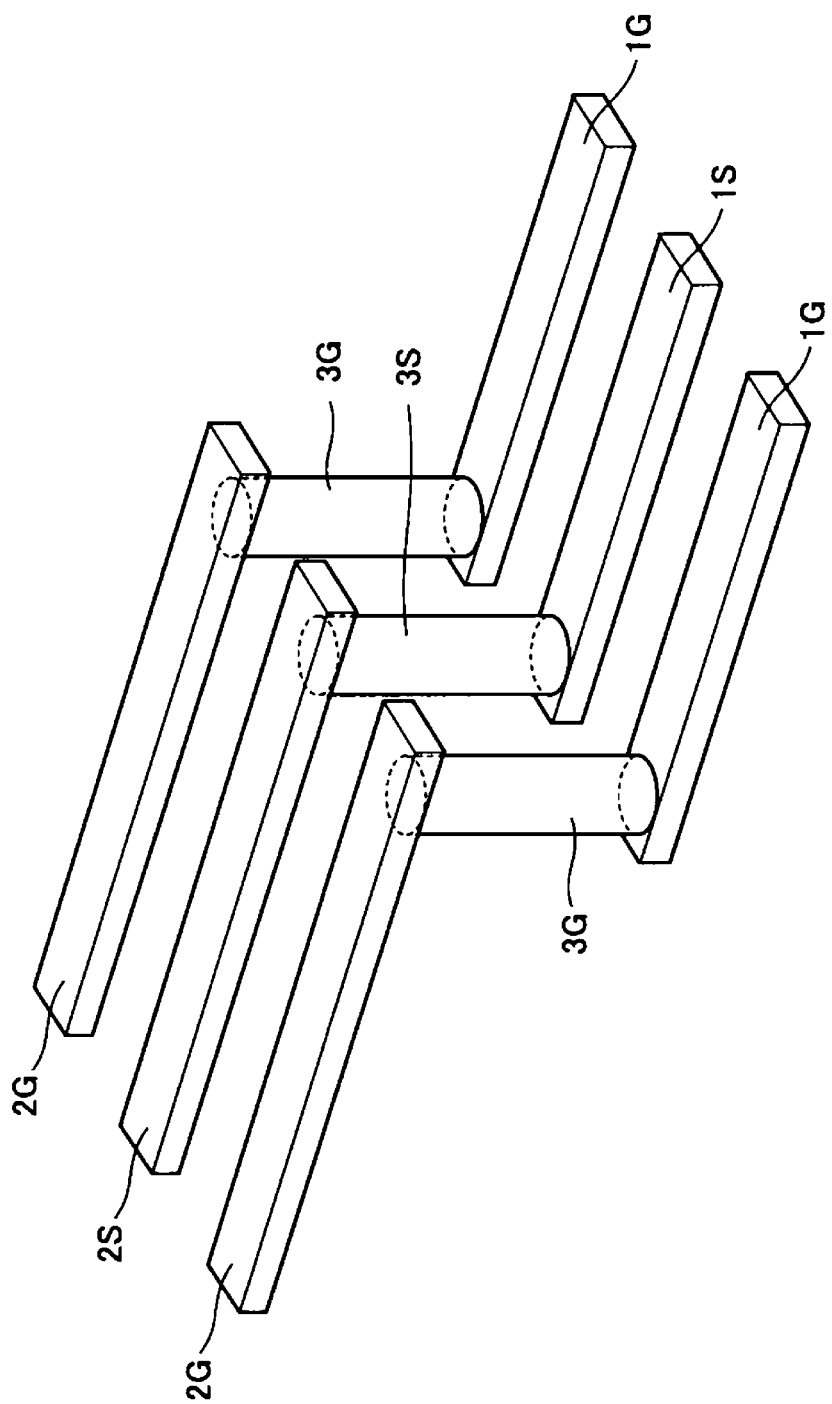
FIG. 10 is a perspective view of a constitution in which an upper coplanar line and a lower coplanar line are simply connected to each other.

FIG. 10 is a perspective view of a constitution in which two coplanar lines are connected to each other by a via layer.

In the constitution shown in FIG. 10, a signal line 1S and ground lines 1G of the coplanar line in a first layer are connected to a signal line 2S and ground lines 2G of the coplanar line in a second layer by via layers 3S and 3G, respectively. That is, the signal lines 1S and 2S are connected to each other by the via layer 3S, and the ground lines 1G and 2G are connected to each other by the via layers 3G.

In this structure, the via layers 3S and 3G have a line structure formed by extending the coplanar lines as they are. Thus, electromagnetic radiation from the via layers 3S and 3G may be increased and affect the operation of a peripheral circuit.

In addition, in this structure, the transmission lines are simply connected to each other by the via layers 3S and 3G. Therefore impedance design for the connecting part (via part) cannot be made.

Thus, when coplanar lines having different characteristic impedances are desired to be connected to each other, it is difficult to realize a connection that achieves impedance matching and which controls reflection to a low level.

In the above-described constitution of Non-Patent Document 1, a ground via layer surrounds a via layer connecting signal lines to each other in close vicinity to the via layer connecting the signal lines to each other, and the via layer connecting the signal lines to each other cannot be directly connected to a coplanar line on a lower semiconductor substrate and is thus connected via a bump.

Because the via layer connecting the signal lines to each other is connected via a bump, the constitution and manufacturing processes are complicated, and the reliability of the connection is lower than in the case where the via layer is directly connected to the signal lines.

In the above-described constitution of Patent Document 1, there are ground layers on the periphery of a part of connection between a via layer and signal lines. However, the respective ground layers on a lower surface and an upper surface of a semiconductor substrate are not connected. Therefore grounded capacitance may fluctuate between the lower surface and the upper surface, and affect signal transmission.

In addition, there is no ground layer on the periphery of the via layer within the semiconductor substrate. Therefore a ground for the via layer is weakened.

Further, the dimensions of the via layer and the ground layers are substantially determined by the dimensions of the coplanar lines, so that there is a low degree of freedom of dimensions. Thus, as in the constitution shown in FIG. 10, it is difficult to achieve impedance matching when an upper high-frequency circuit and a lower high-frequency circuit have different characteristic impedances.

In the present technology, a connecting part connecting the transmission lines of an upper high-frequency circuit and a lower high-frequency circuit to each other is formed so as to be able to suppress electromagnetic radiation from the connecting part.

Then, a structure is realized in which the transmission lines of the high-frequency circuits are connected to each other by only via layers (conductor layers within via holes) in the connecting part connecting the transmission lines to each other and a ground for the via layer connecting the signal lines of the transmission lines to each other is strengthened.

In addition, the achievement of impedance matching is made possible even when the upper and lower high-frequency circuits have different characteristic impedances.

Figure 7:
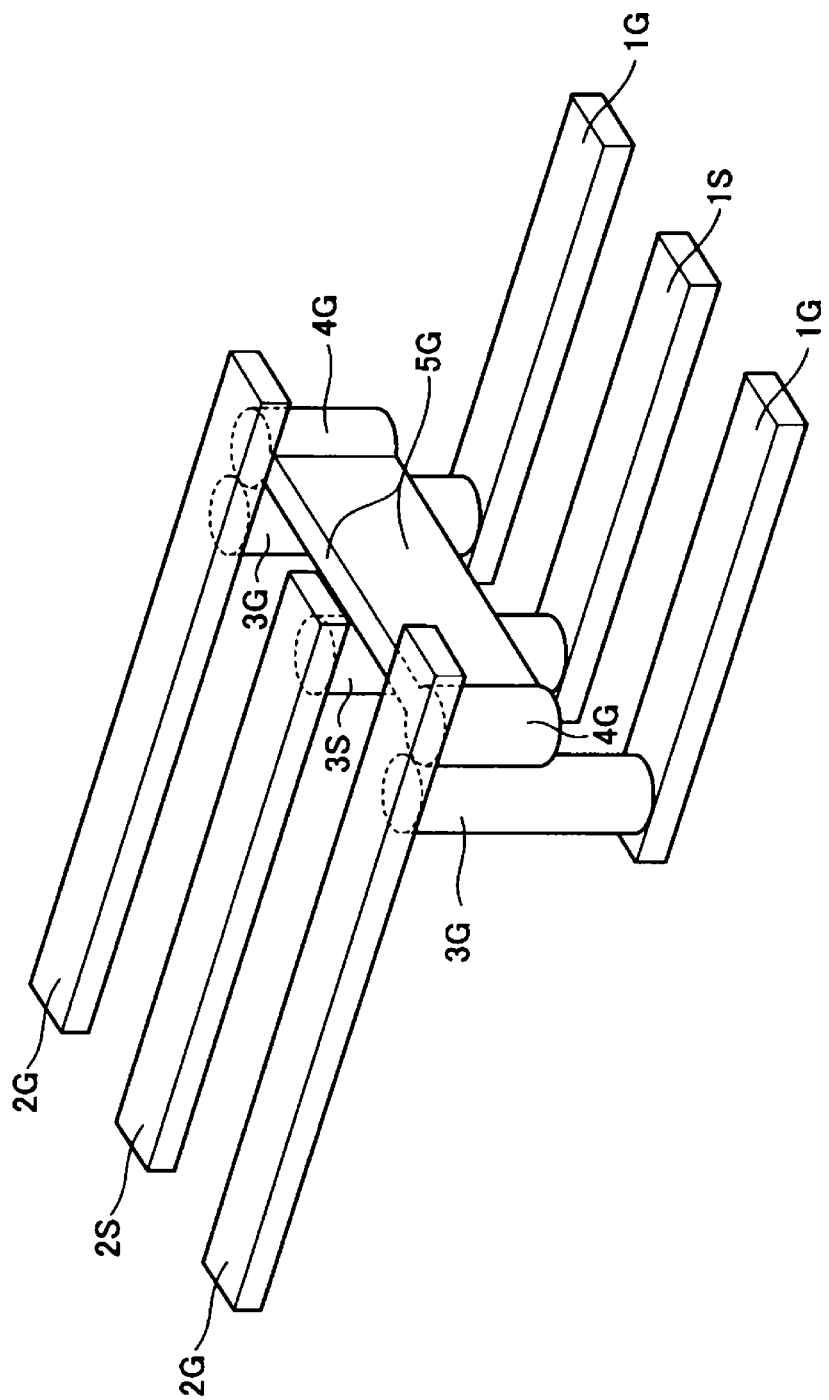
FIG. 7 is a perspective view of assistance in explaining one form of a semiconductor device according to an embodiment of the present technology.

In the present technology, as shown in FIG. 7, which is a schematic perspective view of one form of the present technology, a signal line 1S and ground lines 1G formed on a semiconductor substrate in a lower layer are connected to a signal line 2S and ground lines 2G formed on a semiconductor substrate in an upper layer by via layers 3S and 3G.

In FIG. 7, the signal lines 1S and 2S are connected to each other by the via layer 3S.

The ground lines 1G are connected to the ground lines 2G by the via layers 3G. Shallow via layers 4G are connected to the ground lines 2G in the upper layer in addition to the via layers 3G. Thus, the via layers of a two-leg structure having different depths are connected to the ground lines 2G. The via layers 3G and the shallow via layers 4G are electrically connected to each other as one continuous via layer.

Further, a via layer 5G in the shape of a band is formed so as to make a connection between the shallow via layers 4G connected to the two ground lines 2G. The via layer 5G in the shape of a band is formed with the same depth as the via layers 4G.

Figure 8:
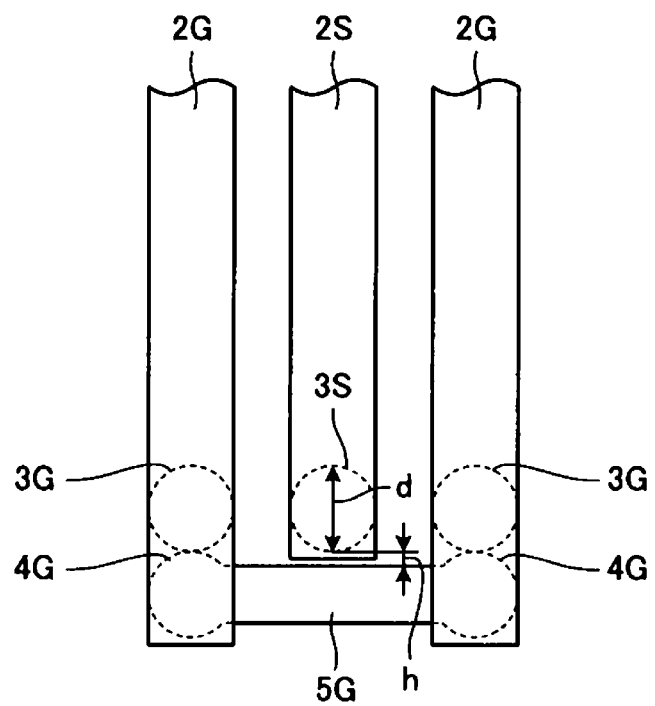
FIG. 8 is a plan view of principal parts of the semiconductor device of FIG. 7.

FIG. 8 is a plan view of principal parts of the semiconductor device in FIG. 7.

The via layer 3S connecting the signal lines 1S and 2S to each other and the via layers 3G connecting the ground lines 1G and 2G to each other are formed in a circular planar pattern.

The via layers 4G and the via layer 5G in the shape of a band are formed in a planar pattern such that the via layers 4G in a circular pattern in parts of the ground lines 1G and 2G are connected to each other by the via layer 5G in a rectangular pattern between the via layers 4G.

As is understood from FIG. 8, the via layer 5G in the shape of a band is formed close to the via layer 3S connecting the signal lines 1S and 2S to each other, but is disposed so as to be opposed to the via layer 3S with an interval between the via layer 5G and the via layer 3S and is insulated from the via layer 3S.

Because the via layer 5G in the shape of a band which via layer is connected to the ground lines 2G is formed close to the via layer 3S connecting the signal lines 1S and 2S to each other, the via layer 5G in the shape of a band strengthens a ground for the via layer 3S connecting the signal lines 1S and 2S to each other.

As will be described later in detail, the characteristic impedance of the via part is determined by the diameter of the via layer 3S for the signal lines 1S and 2S and the interval between the via layer 3S and the via layer 5G in the shape of a band. Thus, the characteristic impedance can be adjusted by adjusting these dimensions. Accordingly, impedance matching can be performed by adjusting the characteristic impedance of the via part even when transmission circuits in the lower layer and the upper layer are different from each other in characteristic impedance.

In the present technology, as in the form shown in FIG. 7 and FIG. 8, a plurality of via layers having different depths are connected to grounds of transmission lines, the grounds in a lower layer and an upper layer are connected to each other by the deeper via layers, and the shallower via layers are connected to the grounds only in one layer (only in the upper layer, for example).

The shallower via layers are combined with a via layer in the shape of a band to form a constitution in which the via layers on parts of the grounds are connected to each other or, as it were, one continuous via layer.

As for the signal lines of the transmission lines, the signal lines in the lower layer and the upper layer are connected to each other by a via layer.

The via layer in the shape of a band is disposed close to the via layer connected to the signal lines so as to be opposed to the via layer connected to the signal lines.

With such a constitution, because the via layer in the shape of a band which via layer is connected to the grounds is disposed close to the via layer connected to the signal lines, a ground is strengthened also in the via part including the via layers.

It is therefore possible to suppress electromagnetic radiation from the via layers in the via part, and thus operate a peripheral circuit stably.

Because the via layers are directly connected to the signal lines and the ground lines without bumps or the like being used, the semiconductor device can be manufactured easily, and sufficient connection reliability can be obtained.

In addition, the present technology makes it possible to freely design intervals between the via layer for the signal lines and the via layers for the grounds and the dimensions of the via layer for the signal lines and the via layers for the grounds irrespective of the dimensions of the signal lines and the grounds of the transmission lines. Therefore the impedance characteristic of the via part can be changed.

Accordingly, even when high-frequency circuits having different characteristic impedances in the lower layer and the upper layer are desired to be connected to each other, signal reflection can be minimized by achieving impedance matching in the via part.

Referring to FIG. 8 of the above-described form, description in the following shows that impedance matching can be achieved by appropriately selecting the diameter d of the via layer connected to the signal lines and a distance h between the via layer connected to the signal lines and the shallow via layer in the shape of a band which via layer is connected to the grounds.

Electromagnetic waves in the via part can be minimized by adjusting a value of 4 h/d from the diameter d of the via layer 3S connected to the signal lines and the interval h between the via layer 3S and the via layer 5G in the shape of a band.

Incidentally, shown in the following is description of principles using theoretical equations, and calculations can be easily made for the design of the shapes of actual via layers by using a commercially available electromagnetic field simulator such as an ANSYS or the like.

From FIG. 8, a structure in which two coplanar lines are connected to each other by the via layer 3S and the via layers 3G and further the via layer 5G in the shape of a band which via layer is connected to the ground lines 2G is disposed close to the via layer 3S can be considered to be a quasi microstrip line.

Thus, impedance conversion can be achieved by the structure of the coplanar line, the microstrip line, and the coplanar line.

Letting Za be the characteristic impedance of the coplanar line part on the semiconductor substrate in the lower layer, and letting Zb be the characteristic impedance of the coplanar line part on the semiconductor substrate in the upper layer, reflection is minimized when the characteristic impedance of the via part is $\sqrt{(Za \times Zb)}$. That is, the impedances can be matched to each other.

Letting d be the diameter of the via layer 3S connected to the signal lines 1S and 2S, and letting h be a distance from the via layer 3S to the via layer 5G in the shape of a band, an approximate value of the characteristic impedance of the via part is $Z\_via = (60/\sqrt{\in r}) \times \ln(4 h/d)$, where $\in r$ is the dielectric constant of a material (usually an insulating material) between the via layer 3S and the via layer 5G in the shape of a band.

An approximate value of the characteristic impedance of the coplanar line parts is $Z\_cop = (30\pi/\sqrt{\in eff}) \times (K'/K)$, where K and K' are constants determined by shape, and $\in eff$ is the dielectric constant of a material (an insulating material or a space) between the signal line and the grounds of the coplanar line.

Thus, when the materials between the pieces of wiring are selected, and the values of parameters of the dielectric constants ($\in r$ and $\in eff$) are determined, reflection in the via part can be minimized by adjusting a ratio between 4 h and d.

It is to be noted that the present technology is not limited to constitutions in which two transmission lines connected to each other by via layers are both a coplanar line, as shown in FIG. 7.

A constitution in which one transmission line is a coplanar line and another transmission line is a microstrip line and a constitution in which two transmission lines are both a microstrip line are also possible.

The characteristic impedance of a microstrip line is different from the characteristic impedance of a coplanar line. Thus, when impedance matching is to be performed for a microstrip line, it suffices to use the characteristic impedance of the microstrip line in place of the above Z_cop.

In addition, in FIG. 7, the deep via layers 3S and 3G connecting the transmission lines in the lower layer and the upper layer to each other and the shallow via layers 4G and 5G including the band-shaped part are formed, and the via layers of two legs are connected to the ground lines 2G.

In the present technology, a constitution in which via layers of three legs or more are connected to grounds can also be adopted. For example, another via layer connected to the ground lines 2G can be provided on an opposite side of the deep via layers 3G from the shallow via layers 4G.

A constitution of the present technology is similar to that of a technology that connects circuits on an upper semiconductor substrate and a lower semiconductor substrate to each other by via layers having different depths as disclosed in Patent Document 2.

Thus, a manufacturing method for forming via layers having different depths can be performed according to the manufacturing method described in Patent Document 2.

The constitution disclosed in Patent Document 2 does not include a constitution corresponding to a via layer in the shape of a band for grounds in an embodiment of the present technology.

However, the manufacturing method described in Patent Document 2 can be used when an opening of a mask at a time of forming a via hole for forming a via layer in the shape of a band in an embodiment of the present technology is formed so as to correspond to a band-shaped pattern.

2. First Embodiment

Concrete embodiments will next be described.

Figure 1A:
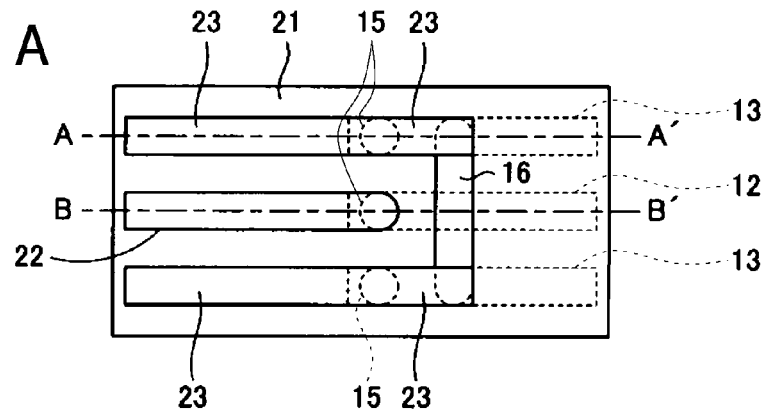
FIGS. 1A, 1B, and 1C are schematic configuration views of a semiconductor device according to a first embodiment.
Figure 1B:
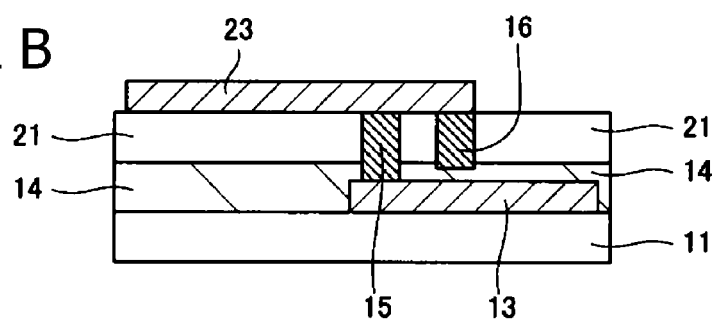
Figure 1C:
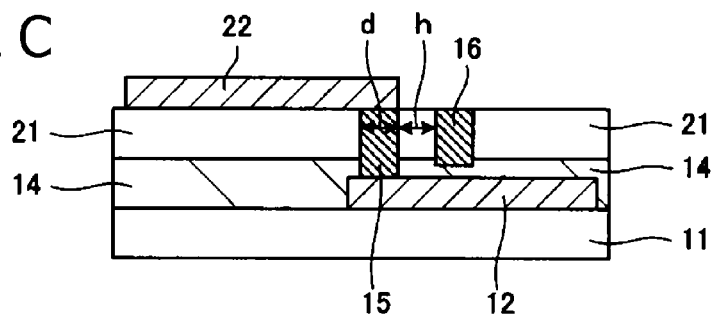

FIGS. 1A to 1C are schematic configuration views of a semiconductor device according to a first embodiment. FIG. 1A is a plan view, FIG. 1B is a sectional view taken along a line A-A' of FIG. 1A, and FIG. 1C is a sectional view taken along a line B-B' of FIG. 1A.

As shown in FIGS. 1A to 1C, a central signal line 12 and two left and right ground lines 13 of a coplanar line are formed on a first semiconductor substrate 11 in a lower layer. In addition, a central signal line 22 and two left and right ground lines 23 of a coplanar line are formed on a second semiconductor substrate 21 in an upper layer.

The first semiconductor substrate 11 in the lower layer and the second semiconductor substrate 21 in the upper layer are laminated with an insulating layer 14 interposed between the first semiconductor substrate 11 and the second semiconductor substrate 21.

The signal line 12 on the first semiconductor substrate 11 and the signal line 22 on the second semiconductor substrate 21 are connected to each other by a first via layer 15 penetrating the second semiconductor substrate 21 and the insulating layer 14. Similarly, the ground lines 13 on the first semiconductor substrate 11 and the ground lines 23 on the second semiconductor substrate 21 are connected to each other by via layers 15 penetrating the second semiconductor substrate 21 and the insulating layer 14.

Various semiconductor materials such as silicon, Ge, SiGe, compound semiconductors, and the like can be used for the first semiconductor substrate 11 and the second semiconductor substrate 21.

In addition, the semiconductor substrates 11 and 21 can be formed by only a semiconductor substrate, a combination of a semiconductor substrate and a semiconductor layer (for example an epitaxially grown layer) on the semiconductor substrate, and the like.

Metallic materials such as Cu, Al, Au, W, and the like can be used for the signal lines 12 and 22 and the ground lines 13 and 23 forming the respective coplanar lines.

The signal lines 12 and 22 and the ground lines 13 and 23 can be formed by a plating method, an evaporation method, or the like using these metallic materials.

Metallic materials such as Cu, Al, Au, W, and the like can be used for the first via layers 15.

The same metallic materials as those of the signal lines 12 and 22 and the ground lines 13 and 23 can be used for the first via layers 15. When the same metallic materials as those of the signal lines 12 and 22 and the ground lines 13 and 23 can be used for the first via layers 15, the resistance of the via layers 15 is lowered, and almost no resistance occurs at the connecting part connecting the signal lines 12 and 22 to each other.

Incidentally, in order to improve a burying quality when forming the via layers 15 by burying a conductor layer within via holes, a metallic material of a better burying quality which material is different from the metallic materials for the signal lines 12 and 22 and the ground lines 13 and 23 can also be used.

The present embodiment includes a second via layer 16, in particular, which penetrates the second semiconductor substrate 21 and which reaches a midway position in the insulating layer 14, separately from the first via layers 15.

The second via layer 16 is formed in a band-shaped planar pattern extending from one of the two ground lines 23 to the other, and is formed at a position somewhat distant from the first via layers 15 on the right of the first via layers 15 in such a manner as to be opposed to the first via layers 15. The planar pattern of the second via layer 16 is obtained by attaching a semicircular shape to both ends of a rectangular shape. The parts of the semicircular shapes are situated between the ground lines 23 in the upper layer and the ground lines 13 in the lower layer.

The second via layer 16 is connected to the ground lines 23 on the second semiconductor substrate 21, but is not connected to the ground lines 13 on the first semiconductor substrate 11. The second via layer 16 is formed so as to be shallower than the first via layers 15.

Only a first via layer 15 is connected to the signal line 22 of the coplanar line in the upper layer. First via layers 15 and the second via layer 16 are each connected to the ground lines 23 of the coplanar line in the upper layer. Thus, the via layers of two legs are connected to the ground lines 23 of the coplanar line in the upper layer.

Metallic materials such as Cu, Al, Au, W, and the like can be used for the second via layer 16.

The same material as that of the first via layers 15 is desirably used for the second via layer 16. This enables the first via layers 15 and the second via layer 16 to be formed simultaneously by filling via holes with the same material.

Because the second via layer 16 connected to the ground lines 23 is provided on the right of the first via layers 15, the second via layer 16 can absorb electromagnetic waves radiated from the first via layers 15, and thus suppress the diffusion of the electromagnetic waves to the outside.

The characteristic impedance of the via layers 15 and 16 is determined by the diameter d of the via layer 15 and an interval h between the via layer 15 and the second via layer 16 as shown in FIG. 1C. Thus, the characteristic impedance of the via layers 15 and 16 can be set by adjusting the diameter d and the interval h.

Then, as described above, characteristic impedance matching can be achieved by making the characteristic impedance of the via part $\sqrt{(Za \times Zb)}$ for the characteristic impedance Za of the coplanar line part in the lower layer and the characteristic impedance Zb of the coplanar line part in the upper layer.

The semiconductor device according to the present embodiment can be manufactured as described in the following, for example. Incidentally, FIGS. 2A to 2O are plan views and sectional views corresponding to FIGS. 1A to 1C.

First, the signal lines and ground lines of coplanar lines are formed on respective semiconductor substrates. Specifically, as shown in FIGS. 2A to 2C, the signal line 12 and the ground lines 13 of a coplanar line are formed on the first semiconductor substrate 11, and the signal line 22 and the ground lines 23 of a coplanar line are formed on the second semiconductor substrate 21.

Figure 2D:
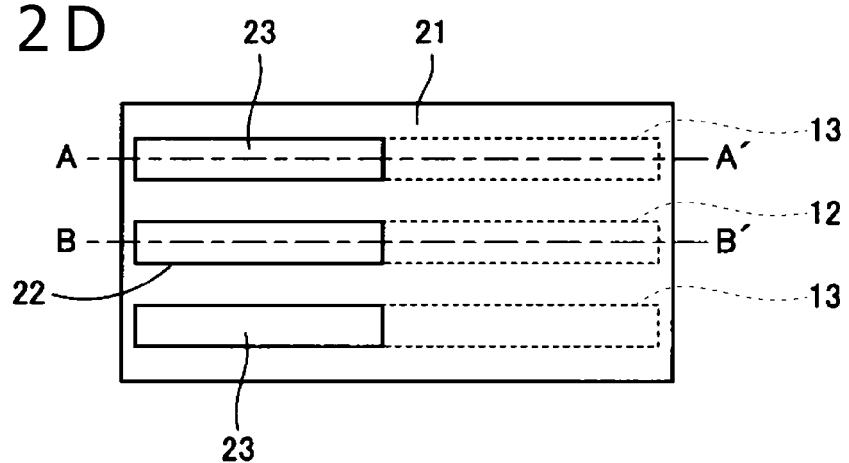
FIGS. 2A to 2O are manufacturing process diagrams of a method for manufacturing the semiconductor device of FIGS. 1A to 1C.
Figure 2E:
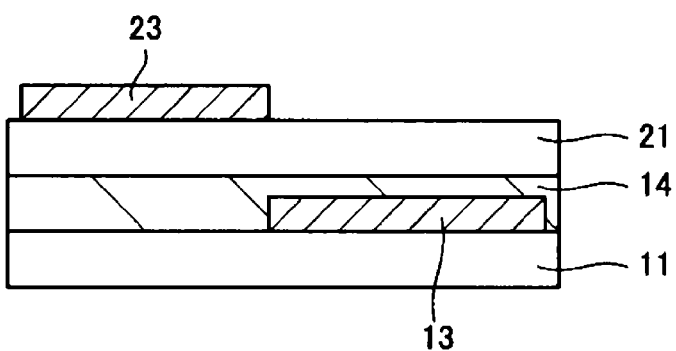
Figure 2F:
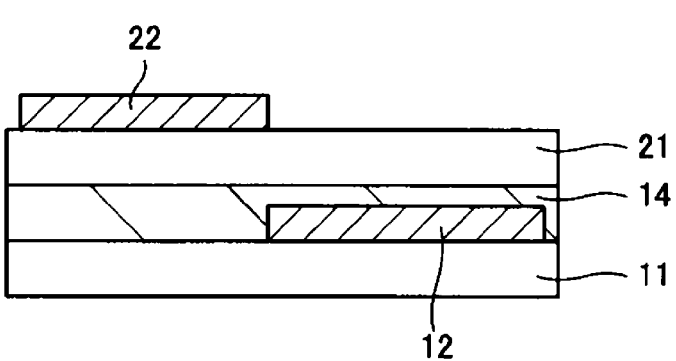

Next, as shown in FIGS. 2D to 2F, the first semiconductor substrate 11 and the second semiconductor substrate 21 are laminated with an insulating layer 14 interposed between the first semiconductor substrate 11 and the second semiconductor substrate 21.

As a concrete method for making a state shown in FIGS. 2D to 2F, for example, the insulating layer 14 is formed so as to cover the signal line 12 and the ground lines 13 on the first semiconductor substrate 11, and the second semiconductor substrate 21 is laminated to the insulating layer 14 by an adhesive or the like.

Alternatively, for example, an insulating layer 14 is formed so as to cover the signal line 12 and the ground lines 13 on the first semiconductor substrate 11, and an insulating layer 14 is formed on a surface (lower surface in FIGS. 2A to 2C) of the second semiconductor substrate 21 which surface is on an opposite side from the signal line 22 and the ground lines 23 on the second semiconductor substrate 21. Then, both the insulating layers 14 are bonded to each other by plasma bonding or an adhesive. When plasma bonding is used, for example, as described in [0052] in Patent Document 2, a plasma TEOS film, a SiON film, or the like is formed on bonding surfaces, then subjected to a plasma process, laminated to each other, and thereafter subjected to an annealing process to bond the two substrates to each other.

Incidentally, when a wiring layer is formed also within the insulating layer 14, for example, the wiring layer is formed above the signal line 12 and the ground lines 13 on the first semiconductor substrate 11. At this time, when a plurality of wiring layers are formed, a multilayer wiring structure is formed with an interlayer insulating film interposed between the plurality of wiring layers.

Next, a resist is formed on an entire surface so as to cover the coplanar lines 22 and 23 on the second semiconductor substrate 21 in the upper layer.

Figure 2G:
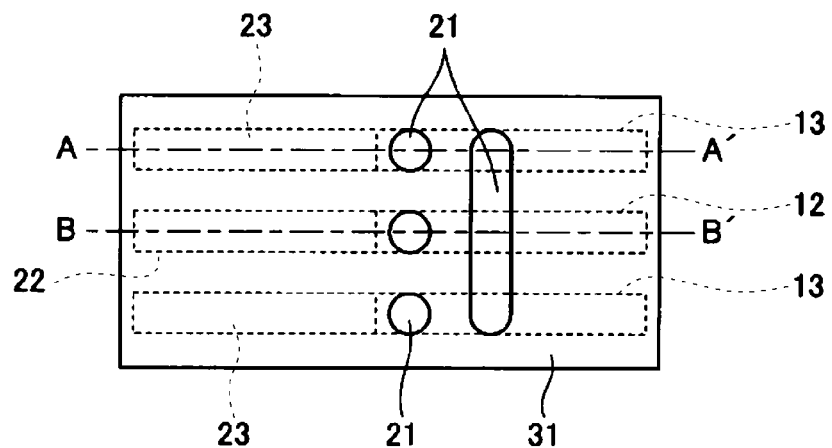
Figure 2H:
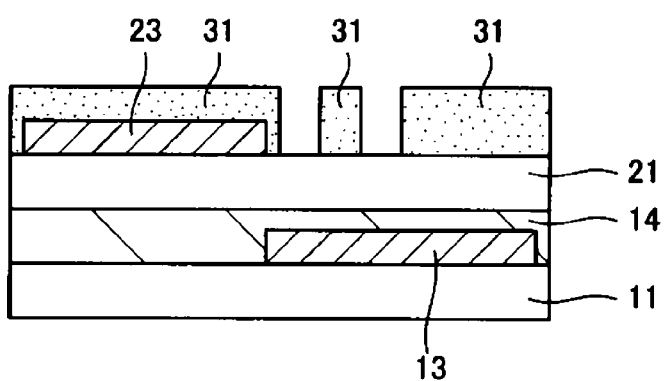
Figure 2I:
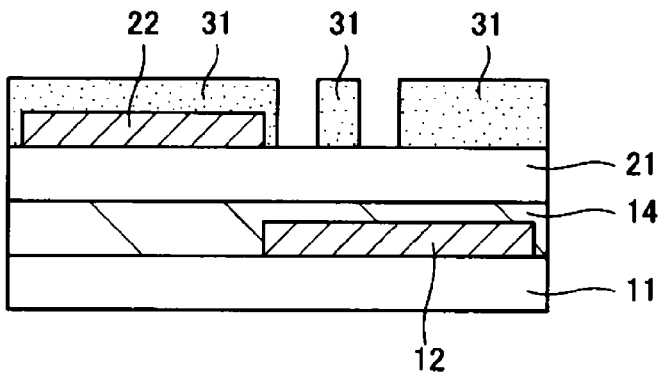

Thereafter, as shown in FIGS. 2G to 2I, the resist is patterned to form a resist mask 31 in a pattern corresponding to openings (via holes) of via parts in which to form via layers. Specifically, the resist mask 31 is formed in a pattern having openings of a deeper via part in the vicinity of an end of the coplanar line 22 and 23 on the second semiconductor substrate 21 in the upper layer and having an opening of a shallower via part on an opposite side from the coplanar line 22 and 23.

At this time, as shown in FIGS. 2G to 2I, the openings of the deeper via part are formed as separate openings for the signal lines and the ground lines, respectively, and the opening of the shallower via part is formed as one continuous opening from one ground line to the other ground line. The openings are formed with a diameter of a few μm to a few ten μm.

Figure 2J:
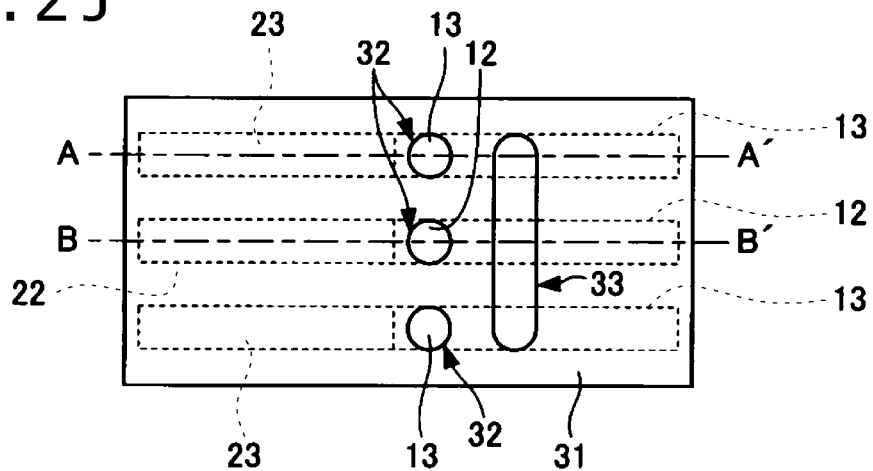
Figure 2K:
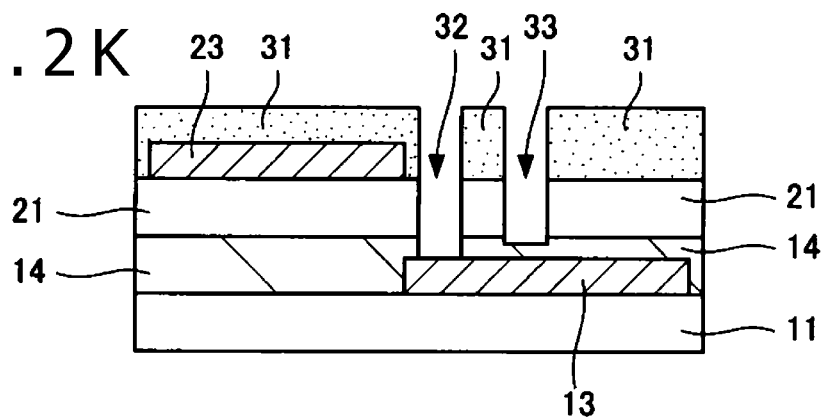
Figure 2L:
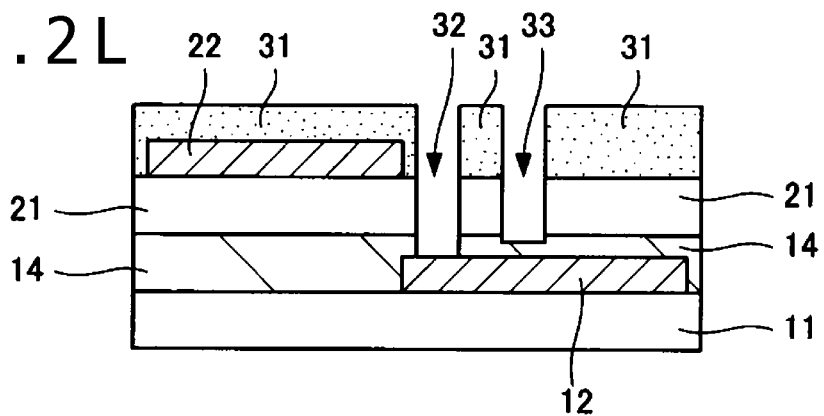

Next, the second semiconductor substrate 21 in the upper layer and the insulating layer 14 are etched from the openings of the resist mask 31. Accordingly, as shown in FIGS. 2J to 2L, deep via holes 32 reaching the coplanar line (the signal line 12 and the ground lines 13) in the lower layer and a shallow via hole 33 reaching a midway position in the insulating layer 14 are formed.

At this time, an etching stopper formed within the insulating layer 14 in advance is desirably used to form the shallow via hole 33 until the shallow via hole 33 reaches the etching stopper. As this etching stopper, a wiring layer within the insulating layer 14 or an insulating layer having etching selectivity with respect to other parts of the insulating layer 14 (for example a silicon nitride film as opposed to a silicon oxide film) can be used.

Next, the resist mask 31 is removed.

Figure 2M:
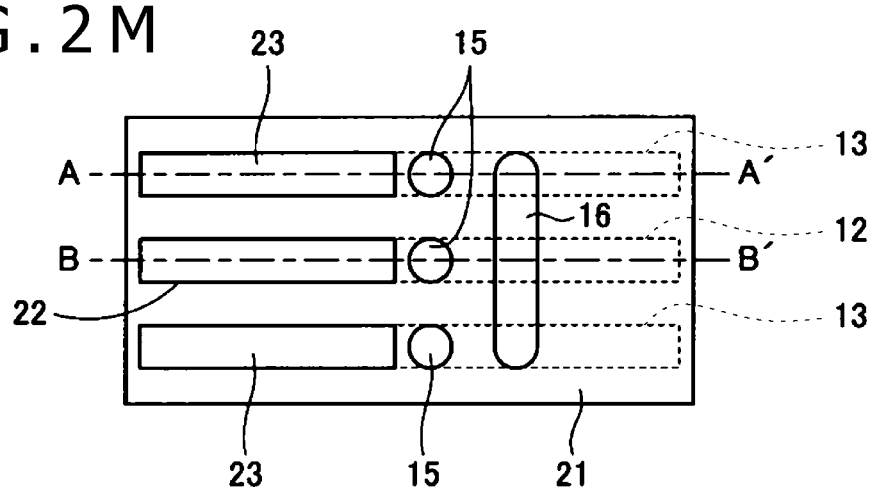
Figure 2N:
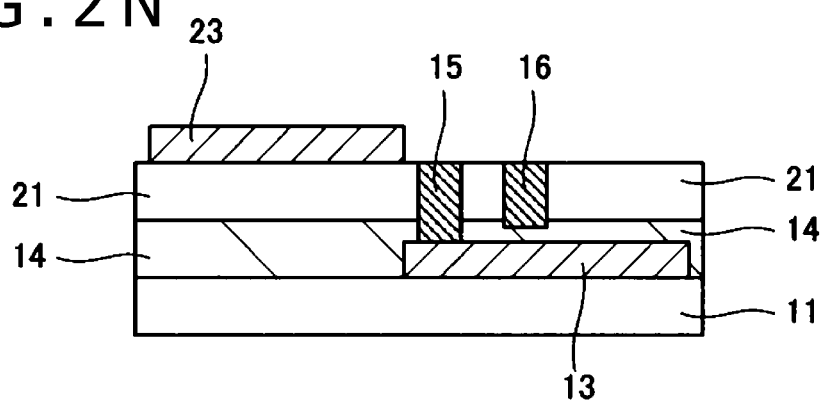
Figure 2O:
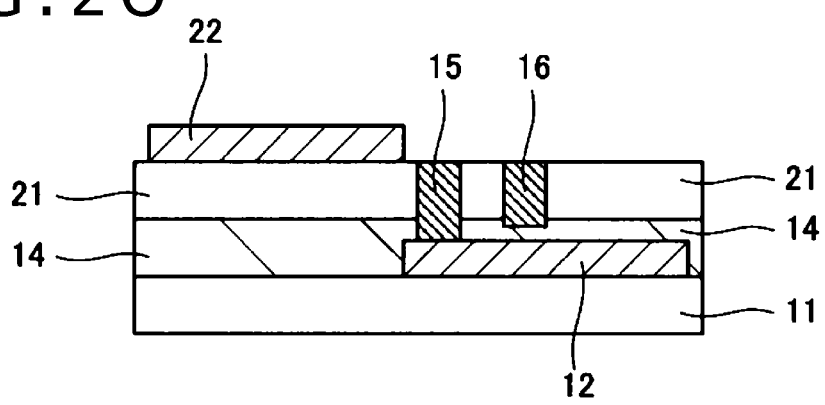

Thereafter, as shown in FIGS. 2M to 2O, the inside of each of the via holes 32 and 33 is filled to form first via layers 15 and a second via layer 16 made of a conductor layer by a plating method, an evaporation method, or the like.

Further, in order to establish a connection between the coplanar line 22 and 23 in the upper layer and the via layers 15 and 16, the coplanar line 22 and 23 is extended using the same metallic material as that of the coplanar line 22 and 23 of the already formed part. Accordingly, as shown in FIGS. 1A to 1C, a structure in which the via layers 15 and 16 are connected to the signal line 22 and the ground lines 23 of the coplanar line can be fabricated.

The semiconductor device shown in FIGS. 1A to 1C can be thus manufactured.

According to the constitution of the semiconductor device according to the present embodiment described above, the via layer 15 for the signal lines which via layer connects the signal lines 12 and 22 to each other and the via layers 15 connecting the ground layers 13 and 23 to each other are provided, whereby the coplanar line in the lower layer and the coplanar line in the upper layer are connected to each other.

Accordingly high frequencies can be transmitted between the coplanar line in the lower layer and the coplanar line in the upper layer.

Because the second via layer 16 in the shape of a band which via layer is connected to the ground lines 23 is disposed so as to be opposed to the via layer 15 for the signal lines which via layer connects the signal lines 12 and 22 to each other, a ground for the via layer 15 for the signal lines can be strengthened.

Accordingly, it is possible to suppress the radiation of electromagnetic waves from the via layer to the outside, and thus operate a peripheral circuit stably.

In addition, according to the present embodiment, the characteristic impedance of the via part including the via layers 15 and 16 can be adjusted by adjusting the dimensions of the via layer 15 for the signal lines and the second via layer 16 (the diameter d and the interval h).

Thus, impedance matching can be achieved even when the characteristic impedances of the coplanar line in the lower layer and the coplanar line in the upper layer which coplanar lines are connected to each other by the via layers 15 and 16 are different from each other.

3. Second Embodiment

Figure 3A:
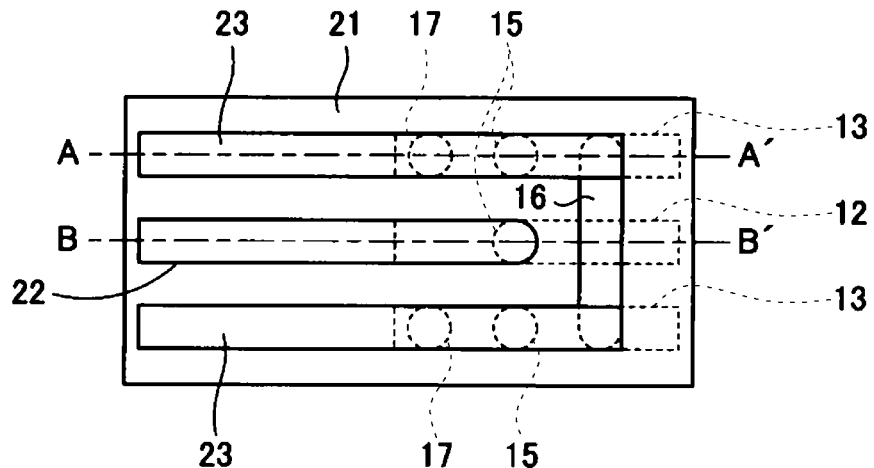
FIGS. 3A, 3B, and 3C are schematic configuration views of a semiconductor device according to a second embodiment.
Figure 3B:
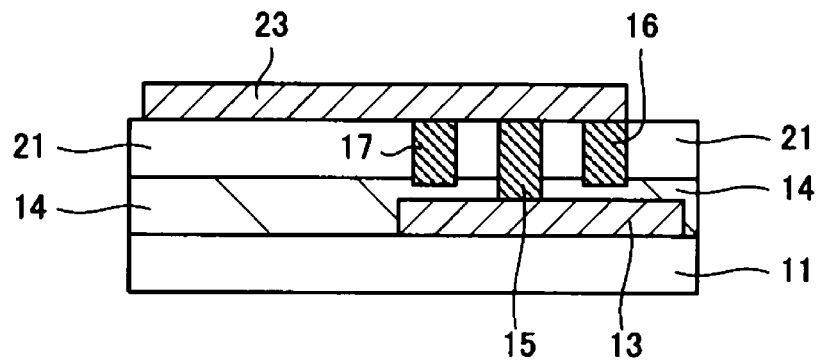
Figure 3C:
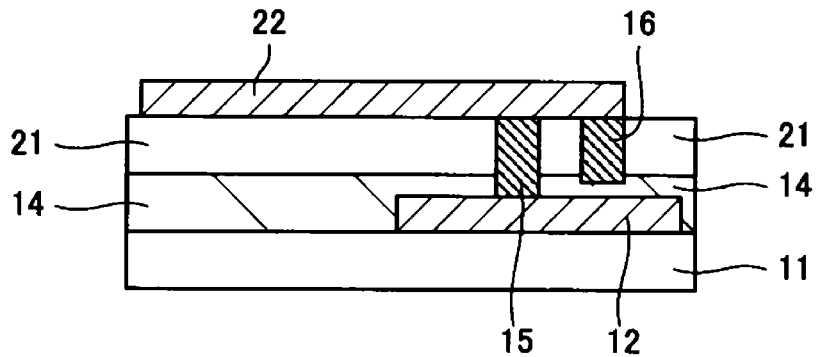

FIGS. 3A to 3C are schematic configuration views of a semiconductor device according to a second embodiment. FIG. 3A is a plan view, FIG. 3B is a sectional view taken along a line A-A' of FIG. 3A, and FIG. 3C is a sectional view taken along a line B-B' of FIG. 3A.

In the present embodiment, via layers of three legs are formed.

In the present embodiment, in particular, as shown in FIGS. 3A to 3C, shallow third via layers 17 are disposed so as to be connected to ground lines 23 of a coplanar line in an upper layer on a nearer side (left side in the figures) of the ground lines 23 than first via layers 15.

The third via layers 17 penetrate a second semiconductor substrate 21, and reach a midway position in an insulating layer 14. The third via layers 17 have a nearly equal depth to that of a second via layer 16.

As with the planar pattern of the first via layers 15, the planar pattern of the third via layers 17 is a circular pattern.

The first via layers 15, the second via layer 16, and the third via layers 17 form the via layers of the three legs for the ground lines 23.

Metallic materials such as Cu, Al, Au, W, and the like can be used for the third via layers 17.

The same material as that of the first via layers 15 is desirably used for the third via layers 17. This enables the first via layers 15 and the third via layers 17 to be formed simultaneously by filling via holes with the same material.

Other constituent elements are similar to those of the first embodiment shown in FIGS. 1A to 1C and are thus identified by the same reference numerals, and repeated description thereof will be omitted.

In the present embodiment, the second via layer 16 connected to the ground lines 23 is disposed on the right of the first via layers 15, and the third via layers 17 connected to the ground lines 23 are disposed on the left of the first via layers 15. Accordingly, each of the second via layer 16 on the right and the third via layers 17 on the left can absorb electromagnetic waves radiated from the first via layers 15, and thus suppress the diffusion of the electromagnetic waves to the outside.

In addition, as in the first embodiment, characteristic impedance can be adjusted by adjusting the diameter of the first via layer 15 and the interval between the first via layer 15 and the second via layer 16.

Then, characteristic impedance matching can be achieved by making the characteristic impedance of the via part √(Za× Zb) for the characteristic impedance Za of the coplanar line part in the lower layer and the characteristic impedance Zb of the coplanar line part in the upper layer.

The semiconductor device according to the present embodiment can be manufactured as described in the following, for example. Incidentally, FIGS. 4A to 4I are plan views and sectional views corresponding to FIGS. 3A to 3C.

First, each of processes up to the lamination of two semiconductor substrates 11 and 21 is performed as in manufacturing processes of the first embodiment shown in FIGS. 2A to 2F.

Next, a resist is formed on an entire surface so as to cover a coplanar line 22 and 23 on the second semiconductor substrate 21 in the upper layer.

Figure 4A:
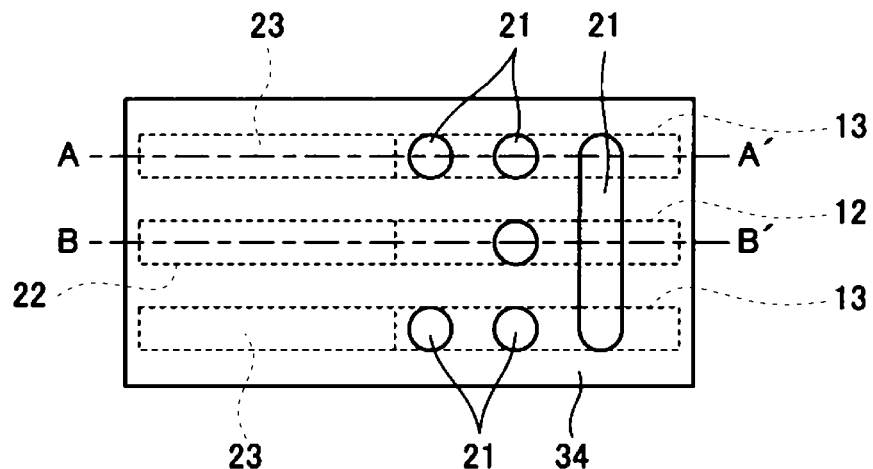
FIGS. 4A to 4I are manufacturing process diagrams of a method for manufacturing the semiconductor device of FIGS. 3A to 3C.
Figure 4B:
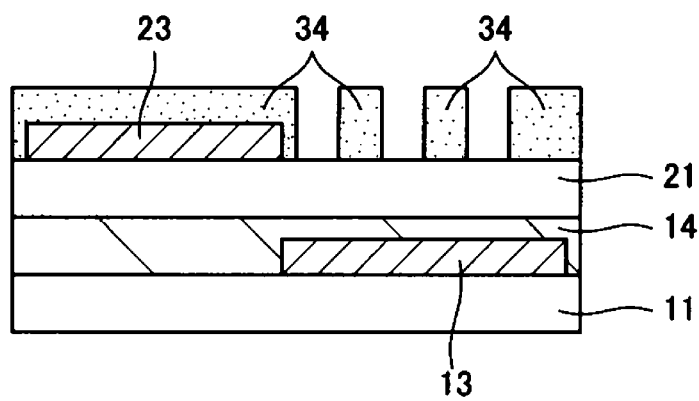
Figure 4C:
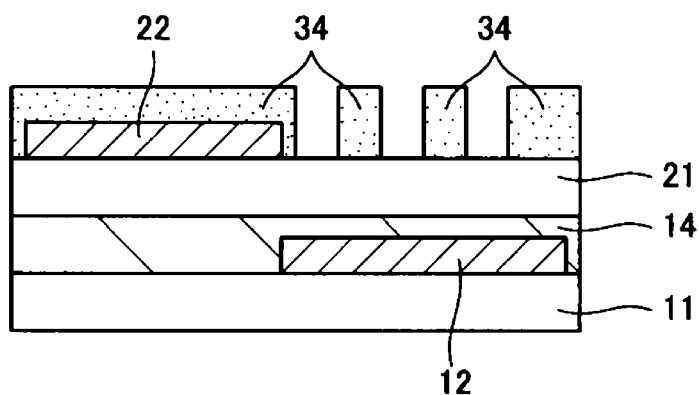

Thereafter, as shown in FIGS. 4A to 4C, the resist is patterned to form a resist mask 34 in a pattern corresponding to openings (via holes) in which to form via layers. Specifically, the resist mask 34 is formed in a pattern having openings for third via layers 17 in the vicinity of an end of the coplanar line 22 and 23 on the second semiconductor substrate 21 in the upper layer, having openings for first via layers 15 in a farther position, and having an opening for a second via layer 16 in an even farther position.

At this time, as shown in FIGS. 4A to 4C, the openings for the third via layers 17 are formed as separate openings in only ground line parts, and the openings for the first via layers 15 are formed as separate openings for signal lines and ground lines, respectively. The opening for the second via layer 16 is formed as one continuous opening from one ground line to the other ground line. The openings are formed with a diameter of a few μm to a few ten μm.

Figure 4D:
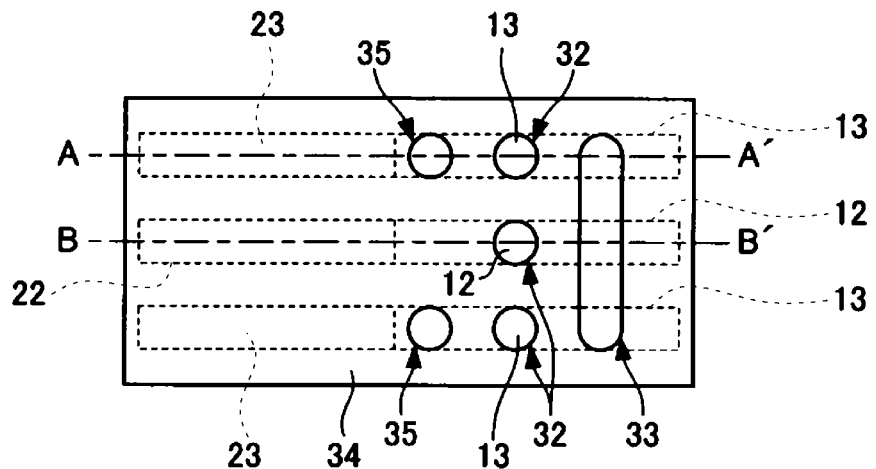
Figure 4E:
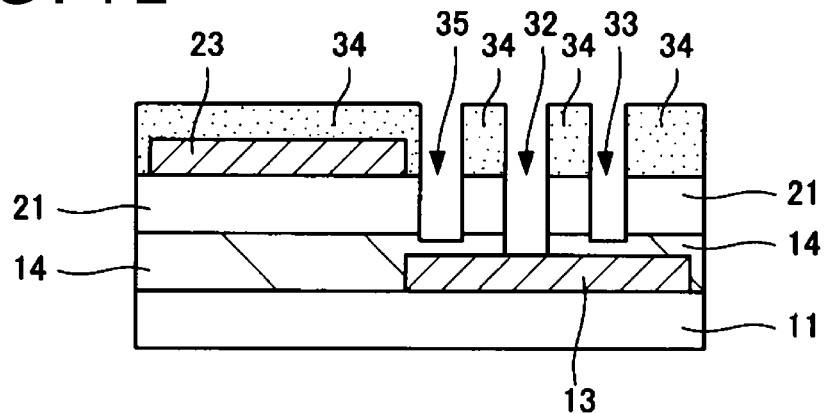
Figure 4F:
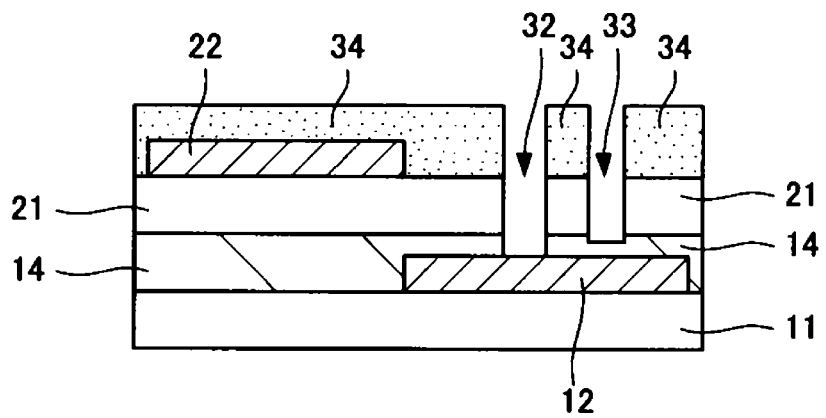

Next, the second semiconductor substrate 21 in the upper layer and the insulating layer 14 are etched from the openings of the resist mask 34. Accordingly, as shown in FIGS. 4D to 4F, deep via holes 32 reaching the coplanar line (the signal line 12 and the ground lines 13) in the lower layer and shallow via holes 33 and 35 reaching a midway position in the insulating layer 14 are formed. Of the shallow via holes 33 and 35, the via hole 33 corresponds to the second via layer 16, and the via holes 35 correspond to the third via layers 17.

At this time, an etching stopper formed within the insulating layer 14 in advance is desirably used to form the shallow via holes 33 and 35 until the shallow via holes 33 and 35 reach the etching stopper. As this etching stopper, a wiring layer within the insulating layer 14 or an insulating layer having etching selectivity with respect to other parts of the insulating layer 14 (for example, a silicon nitride film as opposed to a silicon oxide film) can be used.

Next, the resist mask 34 is removed.

Figure 4G:
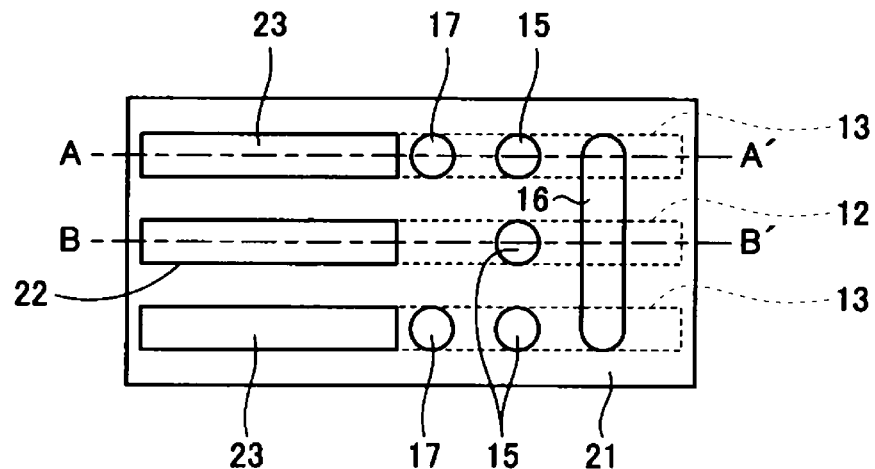
Figure 4H:
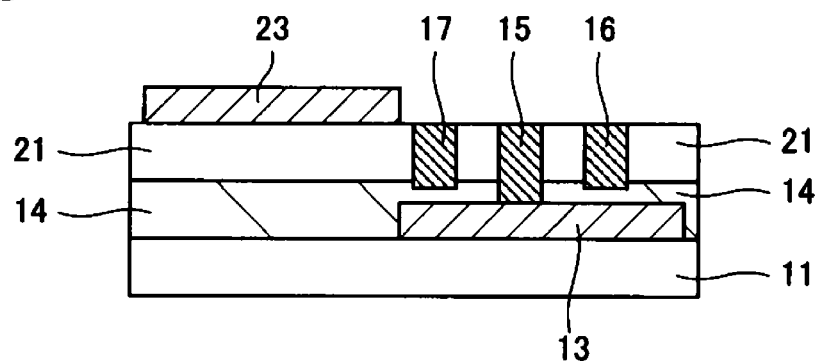
Figure 4I:
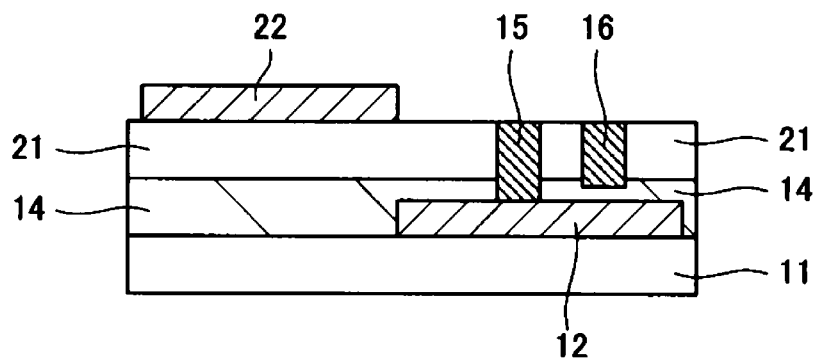

Thereafter, as shown in FIGS. 4G to 4I, the inside of each of the via holes 32, 33, and 35 is filled to form first via layers 15, a second via layer 16, and third via layers 17 made of a conductor layer by a plating method, an evaporation method, or the like.

Further, in order to establish a connection between the coplanar line 22 and 23 in the upper layer and the via layers 15, 16, and 17, the coplanar line 22 and 23 is extended using the same metallic material as that of the coplanar line 22 and 23 of the already formed part. Accordingly, as shown in FIGS. 3A to 3C, a structure in which the via layers 15, 16, and 17 are connected to the signal line 22 and the ground lines 23 of the coplanar line can be fabricated.

The semiconductor device shown in FIGS. 3A to 3C can be thus manufactured.

According to the constitution of the semiconductor device according to the present embodiment described above, the via layer 15 for the signal lines which connects the signal lines 12 and 22 to each other and the via layers 15 connecting the ground layers 13 and 23 to each other are provided, whereby the coplanar line in the lower layer and the coplanar line in the upper layer are connected to each other.

Accordingly, as in the first embodiment, high frequencies can be transmitted between the coplanar line in the lower layer and the coplanar line in the upper layer.

Because the second via layer 16 in the shape of a band which is connected to the ground lines 23 is disposed so as to be opposed to the via layer 15 for the signal lines which connects the signal lines 12 and 22 to each other, a ground for the via layer 15 for the signal lines can be strengthened as in the first embodiment.

It is thereby possible to suppress the radiation of electromagnetic waves from the via layer to the outside, and thus operate a peripheral circuit stably.

In addition, as in the first embodiment, the characteristic impedance of the via part including the via layers 15 and 16 can be adjusted by adjusting the dimensions of the via layer 15 for the signal lines and the second via layer 16 (the diameter d and the interval h).

Thus, impedance matching can be achieved even when the characteristic impedances of the coplanar line in the lower layer and the coplanar line in the upper layer which coplanar lines are connected to each other by the via layers 15 and 16 are different from each other.

Further, according to the present embodiment, the via layers of three legs are formed by providing the third via layers 17 connected to the ground lines 23 on an opposite side of the first via layers 15 for the signal lines from the second via layer 16.

Accordingly, the ground of the via part can be further strengthened as compared with the constitution of the first embodiment.

The foregoing embodiments have a constitution including the first via layers 15 that penetrate the insulating layer 14 and which connect the coplanar lines in the upper layer and the lower layer to each other, and the second via layer 16 or the second via layer 16 and the third via layers 17 that are formed down to a midway position in the insulating layer 14 and which are not connected to the coplanar line in the lower layer.

The present technology includes constitutions in which the second via layer 16 or the second via layer 16 and the third via layers 17 in the foregoing embodiments are further extended downward so that the via layer 16 or these via layers 16 and 17 are connected to the ground lines 13 of the coplanar line in the lower layer.

However, the band-shaped part between one ground line and the other ground line which part is included in the second via layer 16 needs to be insulated from the signal line 12 in the lower layer. Thus, when the second via layer 16 is extended downward, the depth of the via hole in the band-shaped part between the parts of the ground lines is changed from the depth of the via hole in the parts of the ground lines. Such a via hole can be formed by performing etching using a mask twice. For example, etching is performed using a mask having openings in the parts of the ground lines and the band-shaped part between the parts of the ground lines, and thereafter etching is performed using a mask having openings only in the parts of the ground lines until the ground lines in the lower layer are reached.

In the foregoing embodiments, the signal line 12 and the ground lines 13 are formed on the first semiconductor substrate 11, and the signal line 22 and the ground lines 23 are formed on the second semiconductor substrate 21.

In the present technology, the second semiconductor substrate 21 in the upper layer, the signal line 22, and the ground lines 23 can be vertically inverted, and the signal lines 12 and 22 can be connected to each other by a via layer and the ground lines 13 and 23 can be connected to each other by via layers. In this case, because the signal line 22 and the ground lines 23 are disposed on the lower side of the second semiconductor substrate 21, the insulating layer between the first semiconductor substrate 11 and the second semiconductor substrate 21 is made correspondingly thicker. This constitution can be manufactured by forming insulating layers in such a manner as to cover the respective coplanar lines on the semiconductor substrates 11 and 21 and bonding the insulating layers to each other by plasma bonding or the like.

In the foregoing embodiments, the shallow second via layer 16 or the shallow second via layer 16 and the shallow third via layers 17 are connected to only the ground lines 23 of the coplanar line in the upper layer.

In the present technology, as described above, the via layers can be extended downward and connected to the ground lines of the coplanar line in the upper layer and the ground lines of the coplanar line in the lower layer. In addition, in the present technology, the constitution according to each of the foregoing embodiment can be vertically inverted, and the shallow via layers can be connected to only the ground lines of the coplanar line in the lower layer.

In the foregoing embodiments, the respective via layers 15 and 16 or the via layers 15, 16, and 17 connected to the ground lines 23 of the coplanar line in the upper layer are formed separately from each other.

In the present technology, two or more of the plurality of via layers connected to the ground lines can be formed in a state of being put together.

In a case where two via layers are put together, the two via layers can be electrically connected to the ground lines 23 of the coplanar line in the upper layer in the process of extending the ground lines 23 of the coplanar line in the upper layer onto the via layers at the time of manufacturing even when the ground lines 23 are not extended to the via layer on a far side as long as the ground lines 23 are connected to the via layer on a near side.

In the foregoing embodiments, coplanar lines are connected to each other by via layers. However, other constitutions are also possible in the present technology.

For example, a constitution in which a coplanar line and a microstrip line are connected to each other by via layer and a constitution in which microstrip lines are connected to each other by via layer are also possible.

Embodiments of these constitutions will be shown in the following.

4. Third Embodiment

Figure 5A:
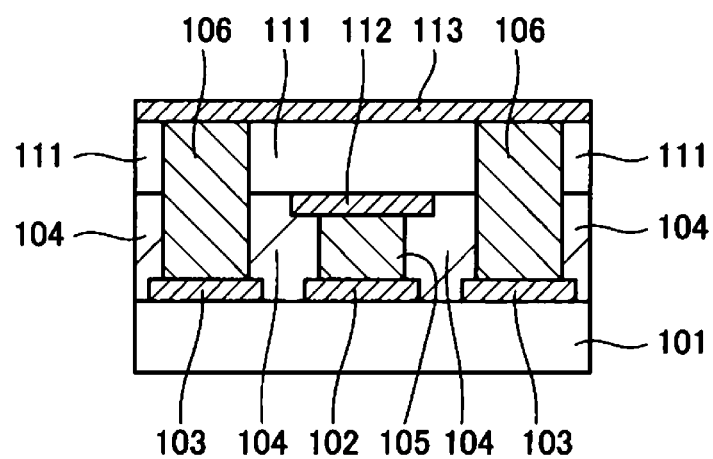
FIGS. 5A and 5B are schematic configuration views of a semiconductor device according to a third embodiment.
Figure 5B:
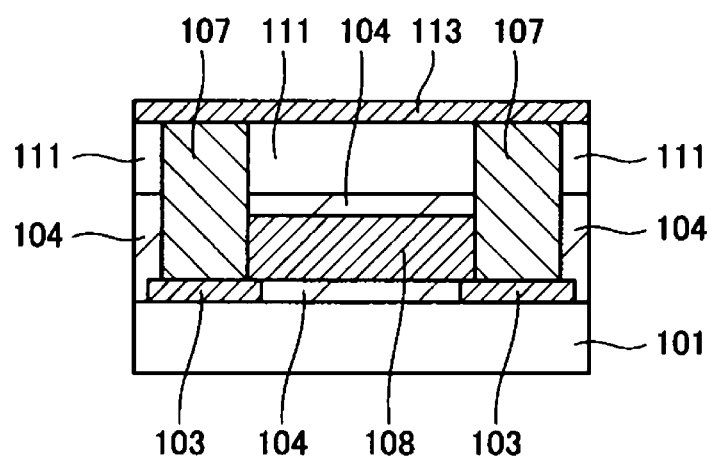

FIGS. 5A and 5B are schematic configuration views (sectional views) of a semiconductor device according to a third embodiment. FIG. 5A is a sectional view of a part including a via layer connected to signal lines. FIG. 5B is a sectional view of a part including a via layer in the shape of a band which via layer is connected to two ground lines.

The present embodiment is a constitution in which a coplanar line and a microstrip line are connected to each other by via layers.

As shown in FIGS. 5A and 5B, a central signal line 102 and two left and right ground lines 103 of the coplanar line are formed on a first semiconductor substrate 101 in a lower layer.

In addition, a signal line 112 of the microstrip line is formed under a second semiconductor substrate 111 in an upper layer, and a ground layer 113 of the microstrip line is formed on the second semiconductor substrate 111.

The first semiconductor substrate 101 in the lower layer and the second semiconductor substrate 111 in the upper layer are laminated with an insulating layer 104 interposed between the first semiconductor substrate 101 and the second semiconductor substrate 111.

The signal line 102 on the first semiconductor substrate 101 and the signal line 112 under the second semiconductor substrate 111 are connected to each other by a first via layer 105 penetrating the insulating layer 104. Though not shown, the first via layer 105 is formed in a circular planar pattern, for example.

The ground lines 103 on the first semiconductor substrate 101 and the ground layer 113 on the second semiconductor substrate 111 are connected to each other by second via layers 106 and third via layers 107 that penetrate each of the second semiconductor substrate 111 and the insulating layer 104. Incidentally, the second via layers 106 in the section of FIG. 5A and the third via layers 107 in the section of FIG. 5B may be formed in respective separate via holes, or may be formed in a partially or wholly continuous via hole. When the second via layers 106 and the third via layers 107 are formed in respective separate via holes, the via holes and the via layers 106 and 107 in a circular planar pattern, for example, are formed.

The signal line 102 of the coplanar line in the lower layer and the signal line 112 of the microstrip line in the upper layer are not formed in the section shown in FIG. 5B. For such a section, it suffices to form a constitution in which the transmission line in the upper layer and the transmission line in the lower layer extend in a same direction, rather than a constitution in which the transmission line in the upper layer and the transmission line in the lower layer extend in respective directions opposite from each other as in the first and second embodiments.

In the section shown in FIG. 5B, a via layer 108 in the shape of a band which via layer connects the third via layers 107 to each other is formed within the insulating layer 104 between the third via layers 107 connecting the ground lines 103 to the ground layer 113. The via layer 108 in the shape of a band is formed in an intermediate part in a direction of depth of the insulating layer 104, and is not in contact with the first semiconductor substrate 101 and the second semiconductor substrate 111.

In the present embodiment, the third via layers 107 and the via layer 108 in the shape of a band between the third via layers 107 can strengthen a ground for the first via layer 105 connecting the signal lines 102 and 112 to each other.

The semiconductor device according to the present embodiment can be manufactured by using a method of bonding parts of insulating layers on semiconductor substrates to each other as disclosed in Patent Document 2, for example.

Specifically, first, a transmission line is formed on each of a first semiconductor substrate 101 and a second semiconductor substrate 111.

Thereafter, an insulating layer 104 for covering the signal line and the like of each of the transmission lines is formed on the first semiconductor substrate 101 and the second semiconductor substrate 111.

Further, a protective film and a bonding film (a plasma TEOS film, a SiON film, or the like) on the protective film are formed on the surfaces of the insulating layers 104 on the respective semiconductor substrates 101 and 111.

Next, each of the semiconductor substrates 101 and 111 is etched so as to reach a predetermined conductor layer (the signal lines 102 and 122, the ground lines 103, and the ground layer 113) or an etching stopper from the bonding film. Thereby via holes corresponding to respective via layers 105, 106, 107, and 108 are formed.

Further, the inside of the via holes is filled with a conductor layer to form the respective via layers 105, 106, 107, and 108.

Thereafter, the second semiconductor substrate 111 is vertically inverted so that the signal line 112 is under the second semiconductor substrate 111, and the insulating layer 104 on the side of the first semiconductor substrate 101 and the insulating layer 104 on the side of the second semiconductor substrate 111 are bonded to each other at the parts of the bonding films. A method such as plasma bonding or the like is used for the bonding.

The semiconductor device shown in FIGS. 5A and 5B can be thus manufactured.

Incidentally, the constitution of the present third embodiment can be modified such that the transmission line in the upper layer and the transmission line in the lower layer extend in respective opposite directions from each other as in the first and second embodiments. In this case, the via layer 108 in the shape of a band is formed so as to be insulated from the signal line present in the section including the via layer 108 in the shape of a band (the signal line 102 in the lower layer or the signal line 112 in the upper layer).

In addition, the via layer 108 in the shape of a band is not limited to the constitution in which the via layer 108 is formed in only the intermediate part in the direction of depth of the insulating layer 104, but can be formed in contact with the second semiconductor substrate 111, or penetrate even the second semiconductor substrate to be connected to the ground layer 113.

However, because the first via layer 105 connecting the signal lines 102 and 112 to each other is formed only inside the insulating layer 104, a sufficient ground strengthening effect is obtained when the via layer 108 in the shape of a band is formed inside the insulating layer 104.

In addition, the third via layers 107 and the via layer 108 in the shape of a band can have a same depth and be shallower than in FIG. 5B so as not to be connected to the ground lines 103 in the lower layer (as with the shallow via layers 16 and 17 in the foregoing embodiments).

According to the constitution of the present embodiment described above, the third via layers 107 connected to the ground lines 103 and the via layer 108 in the shape of a band connecting the third via layers 107 to each other are formed for the first via layer 105 connecting the signal lines 102 and 112 to each other in the other section than that including the first via layer 105.

Thus, the third via layers 107 and the via layer 108 in the shape of a band formed in the other section can strengthen a ground for the first via layer 105 connecting the signal lines 102 and 112 to each other.

It is thereby possible to suppress the radiation of electromagnetic waves from the first via layer 105 to the outside, and thus operate a peripheral circuit stably.

In addition, according to the constitution of the present embodiment, based on FIG. 1C and the like, the characteristic impedance of the via part including the via layers 105 and 108 can be adjusted by adjusting the diameter of the first via layer 105 and an interval between the first via layer 105 and the via layer 108 in the shape of a band.

Thus, impedance matching can be achieved by the via part even when the characteristic impedances of the coplanar line in the lower layer and the microstrip line in the upper layer are different from each other.

Incidentally, while the transmission line in the lower layer is a coplanar line and the transmission line in the upper layer is a microstrip line in the constitution of the third embodiment, the transmission line in the lower layer may be a microstrip line, and the transmission line in the upper layer may be a coplanar line. In this case, it suffices to vertically invert the constitution of FIGS. 5A and 5B, for example.

Because via holes and via layers are not allowed to penetrate the ground layer of a microstrip line, the ground layer of a microstrip line is disposed on an opposite side from a side where laminated semiconductor substrates are opposed to each other.

In the present technology, the transmission lines of three or more semiconductor substrates can be connected to each other. However, when the transmission lines of three or more semiconductor substrates are connected to each other, a microstrip line can be used for a lowermost semiconductor substrate and an uppermost semiconductor substrate, but cannot be used for an intermediate semiconductor substrate other than the lowermost semiconductor substrate and the uppermost semiconductor substrate.

5. Fourth Embodiment

Figure 6A:
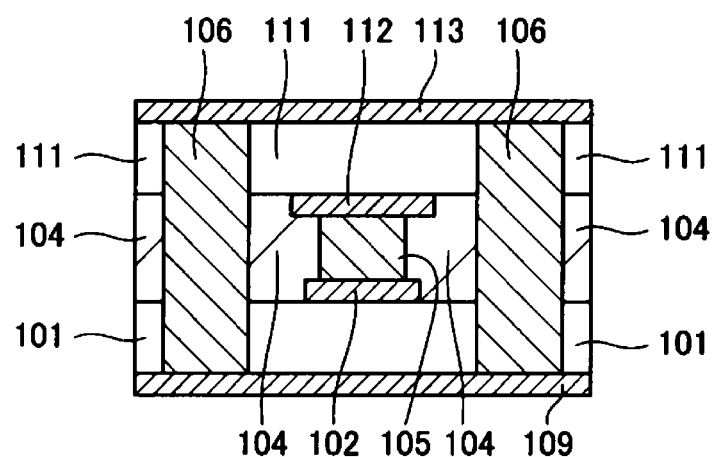
FIGS. 6A and 6B are schematic configuration views of a semiconductor device according to a fourth embodiment.
Figure 6B:
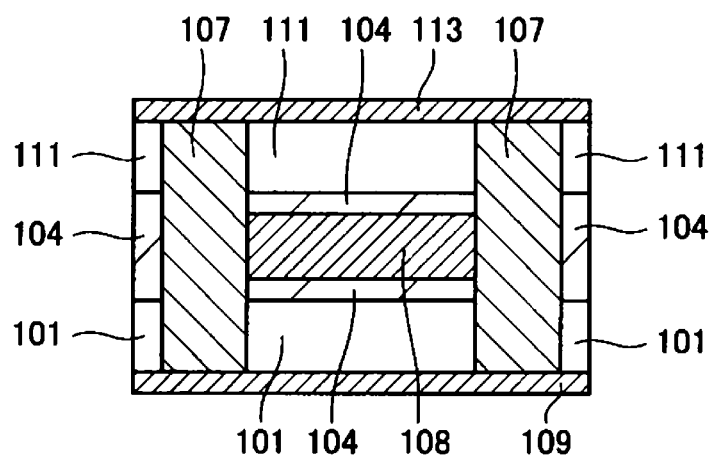

FIGS. 6A and 6B are schematic configuration views (sectional views) of a semiconductor device according to a fourth embodiment. FIG. 6A is a sectional view of a part including a via layer connected to signal lines. FIG. 6B is a sectional view of a part including a via layer in the shape of a band which via layer is connected to ground lines.

The present embodiment is a constitution in which microstrip lines are connected to each other by via layers.

As shown in FIGS. 6A and 6B, a signal line 102 of a microstrip line is formed on a first semiconductor substrate 101 in a lower layer, and a ground layer 109 of the microstrip line is formed under the first semiconductor substrate 101. In addition, a signal line 112 of a microstrip line is formed under a second semiconductor substrate 111 in an upper layer, and a ground layer 113 of the microstrip line is formed on the second semiconductor substrate 111.

The first semiconductor substrate 101 in the lower layer and the second semiconductor substrate 111 in the upper layer are laminated with an insulating layer 104 interposed between the first semiconductor substrate 101 and the second semiconductor substrate 111.

The signal line 102 on the first semiconductor substrate 101 and the signal line 112 under the second semiconductor substrate 111 are connected to each other by a first via layer 105 penetrating the insulating layer 104. Though not shown, the first via layer 105 is formed in a circular planar pattern, for example.

The ground layer 109 under the first semiconductor substrate 101 and the ground layer 113 on the second semiconductor substrate 111 are connected to each other by second via layers 106 and third via layers 107 that penetrate the second semiconductor substrate 111, the insulating layer 104, and the first semiconductor substrate 101. Incidentally, the second via layers 106 in the section of FIG. 6A and the third via layers 107 in the section of FIG. 6B may be formed in respective separate via holes, or may be formed in a partially or wholly continuous via hole. When the second via layers 106 and the third via layers 107 are formed in respective separate via holes, the via holes and the via layers 106 and 107 in a circular planar pattern, for example, are formed.

The signal line 102 of the microstrip line in the lower layer and the signal line 112 of the microstrip line in the upper layer are not formed in the section shown in FIG. 6B. For such a section, it suffices to form a constitution in which the transmission line in the upper layer and the transmission line in the lower layer extend in a same direction, rather than a constitution in which the transmission line in the upper layer and the transmission line in the lower layer extend in respective directions opposite from each other as in the first and second embodiments.

In the section shown in FIG. 6B, a via layer 108 in the shape of a band which via layer connects the third via layers 107 to each other is formed within the insulating layer 104 between the third via layers 107 connecting the ground layer 109 to the ground layer 113. The via layer 108 in the shape of a band is formed in an intermediate part in a direction of depth of the insulating layer 104, and is not in contact with the first semiconductor substrate 101 and the second semiconductor substrate 111.

In the present embodiment, the third via layers 107 and the via layer 108 in the shape of a band between the third via layers 107 can strengthen a ground for the first via layer 105 connecting the signal lines 102 and 112 to each other.

The semiconductor device according to the present embodiment can be manufactured by using a method of bonding parts of insulating layers on semiconductor substrates to each other as disclosed in Patent Document 2, for example.

Specifically, first, a transmission line is formed on each of a first semiconductor substrate 101 and a second semiconductor substrate 111.

Thereafter, an insulating layer 104 for covering the signal line and the like of each of the transmission lines is formed on the first semiconductor substrate 101 and the second semiconductor substrate 111.

Further, a protective film and a bonding film (a plasma TEOS film, a SiON film, or the like) on the protective film are formed on the surfaces of the insulating layers 104 on the respective semiconductor substrates 101 and 111.

Next, each of the semiconductor substrates 101 and 111 is etched so as to reach a predetermined conductor layer (the signal lines 102 and 122 and the ground layers 109 and 113) or an etching stopper from the bonding film. Thereby via holes corresponding to respective via layers 105, 106, 107, and 108 are formed.

Further, the inside of the via holes is filled with a conductor layer to form the respective via layers 105, 106, 107, and 108.

Thereafter, the second semiconductor substrate 111 is vertically inverted so that the signal line 112 is under the second semiconductor substrate 111, and the insulating layer 104 on the side of the first semiconductor substrate 101 and the insulating layer 104 on the side of the second semiconductor substrate 111 are bonded to each other at the parts of the bonding films. A method such as plasma bonding or the like is used for the bonding.

The semiconductor device shown in FIGS. 6A and 6B can be thus manufactured.

Incidentally, the constitution of the present fourth embodiment can be modified such that the transmission line in the upper layer and the transmission line in the lower layer extend in respective opposite directions from each other as in the first and second embodiments. In this case, the via layer 108 in the shape of a band is formed so as to be insulated from the signal line present in the section including the via layer 108 in the shape of a band (the signal line 102 in the lower layer or the signal line 112 in the upper layer).

In addition, the via layer 108 in the shape of a band is not limited to the constitution in which the via layer 108 is formed in only the intermediate part in the direction of depth of the insulating layer 104, but can be formed in contact with the second semiconductor substrate 111, or penetrate even the second semiconductor substrate to be connected to the ground layer 113.

However, because the first via layer 105 connecting the signal lines 102 and 112 to each other is formed only inside the insulating layer 104, a sufficient ground strengthening effect is obtained when the via layer 108 in the shape of a band is formed inside the insulating layer 104.

In addition, the third via layers 107 and the via layer 108 in the shape of a band can have a same depth and be shallower than in FIG. 6B so as not to be connected to the ground layer 109 in the lower layer (as with the shallow via layers 16 and 17 in the foregoing embodiments).

According to the constitution of the present embodiment described above, the third via layers 107 connected to the ground layer 109 and the via layer 108 in the shape of a band connecting the third via layers 107 to each other are formed for the first via layer 105 connecting the signal lines 102 and 112 to each other in the other section than that including the first via layer 105.

Accordingly, the third via layers 107 and the via layer 108 in the shape of a band formed in the other section can strengthen a ground for the first via layer 105 connecting the signal lines 102 and 112 to each other.

It is thereby possible to suppress the radiation of electromagnetic waves from the first via layer 105 to the outside, and thus operate a peripheral circuit stably.

In addition, according to the constitution of the present embodiment, based on FIG. 1C and the like, the characteristic impedance of the via part including the via layers 105 and 108 can be adjusted by adjusting the diameter of the first via layer 105 and an interval between the first via layer 105 and the via layer 108 in the shape of a band.

Thus, impedance matching can be achieved by the via part even when the characteristic impedances of the microstrip line in the lower layer and the microstrip line in the upper layer are different from each other.

In the present technology, the transmission lines of three or more semiconductor substrates can be connected to each other.

However, the constitution of the fourth embodiment has the ground layers 109 and 113 on an upper side and a lower side, so that a signal line of a transmission line of another semiconductor substrate cannot be connected to the sides of the ground layers 109 and 113.

While the planar patterns of via layers within separate via holes in each of the embodiments described above are a circular shape, the planar patterns of via layers within separate via holes in the present technology can also be other shapes than a circular shape. For example, the planar patterns of via layers within separate via holes in the present technology can also be ellipses, polygons such as octagons, hexagons, and the like, squares and rectangles, and shapes formed by rounding corner parts of polygons, squares, and rectangles.

When a planar pattern is a shape other than a circular shape, it suffices to perform calculation using a dimension of the planar pattern which dimension corresponds to the diameter of the circular shape as a parameter forming the characteristic impedance of the via layer in place of the diameter of the circular shape.

Incidentally, the present disclosure can also adopt the following constitutions.

(1) A semiconductor device including:
a first semiconductor substrate and a second semiconductor substrate laminated with an insulating layer interposed between the first semiconductor substrate and the second semiconductor substrate; a first transmission line formed on the first semiconductor substrate, the first transmission line including a signal line and a ground; a second transmission line formed on the second semiconductor substrate, the second transmission line including a signal line and a ground; a first via layer for the signal lines, the first via layer for the signal lines being formed of a conductor layer formed within a via hole, and connected to the signal line of the first transmission line and the signal line of the second transmission line; a first via layer for the grounds, the first via layer for the grounds being formed of a conductor layer formed within a via hole, and connected to the ground of the first transmission line and the ground of the second transmission line; and a second via layer for the grounds, the second via layer for the grounds being formed of a conductor layer formed within a via hole, connected to the ground of the first transmission line and/or the ground of the second transmission line, and including a via layer in a shape of a band, the via layer in the shape of the band being formed so as to be opposed to the first via layer for the signal lines.

(2) The semiconductor device according to the above (1), wherein the second via layer is formed so as to be shallower than the first via layer.

(3) The semiconductor device according to the above (1) or (2), further including a third via layer for the grounds on an opposite side of the second via layer from the first via layer, the third via layer for the grounds being formed of a conductor layer formed within a via hole, and connected to the ground of the second transmission line.

(4) The semiconductor device according to any of the above (1) to (3), wherein the first transmission line and the second transmission line are each a coplanar line.

(5) The semiconductor device according to any of the above (1) to (3), wherein one of the first transmission line and the second transmission line is a coplanar line, and the other is a microstrip line.

(6) The semiconductor device according to any of the above (1) to (3), wherein the first transmission line and the second transmission line are each a microstrip line.

(7) The semiconductor device according to any of the above (1) to (6), wherein for a characteristic impedance Za of the first transmission line and a characteristic impedance Zb of the second transmission line, a characteristic impedance of a via part including the via layer for the signal lines and the second via layer is $\sqrt{(Za \times Zb)}$.

The present technology is not limited to the foregoing embodiments, but various other constitutions can be adopted without departing from the spirit of the present technology.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2011-087048 filed in the Japan Patent Office on Apr. 11, 2011, the entire content of which is hereby incorporated by reference.

What is claimed is:

1. A semiconductor device comprising:
a first semiconductor substrate and a second semiconductor substrate laminated with an insulating layer interposed between the first semiconductor substrate and the second semiconductor substrate;
a first transmission line formed on said first semiconductor substrate, the first transmission line including a signal line and a ground;
a second transmission line formed on said second semiconductor substrate, the second transmission line including a signal line and a ground;
a first via layer for the signal lines, the first via layer for the signal lines being formed of a conductor layer formed within a via hole, and connected to the signal line of said first transmission line and the signal line of said second transmission line;
a first via layer for the grounds, the first via layer for the grounds being formed of a conductor layer formed within a via hole, and connected to the ground of said first transmission line and the ground of said second transmission line; and
a second via layer for the grounds, the second via layer for the grounds being formed of a conductor layer formed within a via hole, connected to the ground of said first transmission line and/or the ground of said second transmission line, and including a via layer in a shape of a band, the via layer in the shape of the band being formed so as to be opposed to said first via layer for the signal lines.

2. The semiconductor device according to claim 1, wherein said second via layer is formed so as to be shallower than said first via layer for the grounds.

3. The semiconductor device according to claim 1, wherein said first transmission line and said second transmission line are each a coplanar line.

4. The semiconductor device according to claim 1, wherein one of said first transmission line and said second transmission line is a coplanar line, and the other is a microstrip line.

5. The semiconductor device according to claim 1, wherein said first transmission line and said second transmission line are each a microstrip line.

6. The semiconductor device according to claim 1, wherein for a characteristic impedance Za of said first transmission line and a characteristic impedance Zb of said second transmission line, a characteristic impedance of a via part including said via layer for the signal lines and said second via layer is $\sqrt{(Za \times Zb)}$.

* * * * *